US010611523B2

(12) United States Patent
Rosenblatt

(10) Patent No.: US 10,611,523 B2
(45) Date of Patent: *Apr. 7, 2020

(54) ACTIVE ELECTRONIC MEDIA DEVICE PACKAGING

(71) Applicant: Apple Inc., Cupertino, CA (US)

(72) Inventor: Michael Rosenblatt, Cupertino, CA (US)

(73) Assignee: Apple Inc., Cupertino, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/193,922

(22) Filed: Nov. 16, 2018

(65) Prior Publication Data
US 2019/0084723 A1  Mar. 21, 2019

Related U.S. Application Data

(60) Continuation of application No. 15/187,341, filed on Jun. 20, 2016, now Pat. No. 10,131,466, which is a
(Continued)

(51) Int. Cl.
H02J 50/20 (2016.01)
B65D 25/02 (2006.01)
B65D 75/52 (2006.01)
G06F 1/16 (2006.01)
G08C 19/00 (2006.01)
H03K 17/94 (2006.01)
(Continued)

(52) U.S. Cl.
CPC ............. B65D 25/02 (2013.01); B65D 75/52 (2013.01); B65D 75/566 (2013.01); G06F 1/1632 (2013.01); G08C 19/00 (2013.01);
H02J 50/20 (2016.02); H02J 50/80 (2016.02); H03K 17/94 (2013.01); H04B 7/26 (2013.01); B65D 2201/00 (2013.01); Y10T 307/766 (2015.04)

(58) Field of Classification Search
CPC ...... B65D 25/02; B65D 75/52; B65D 75/566; B65D 2201/00; H02J 50/80; H02J 50/20; H02J 17/00; H03K 17/94; G06F 1/1632; G08C 19/00; H04B 7/26; Y10T 307/766
USPC .......................................................... 455/39
See application file for complete search history.

(56) References Cited

U.S. PATENT DOCUMENTS 3,707,679 A * 12/1972 Bruley ................... H04B 7/155
                                                        455/16
RE28,198 E * 10/1974 Dobras ................ G06K 7/0166
                                                        235/435
(Continued)

Primary Examiner — Hai V Nguyen
(74) Attorney, Agent, or Firm — Sterne, Kessler, Goldstein & Fox P.L.L.C.

(57) ABSTRACT

Active packaging for supplying power, data, or both power and data to an electronic media device while the device is housed within the active packaging is provided. The active packaging may include one or more electrical traces in-molded or printed onto the packaging that couple to a suitable connector on the device. Power may also be provided via one or more wireless power techniques. Multiple active packages may be conductively stacked to transmit power, data, or both power and data to a row or stack or devices. POM sensors integrated with or attached to the device (or the active packaging itself) may detect various movement events. Coordinated and synchronized display effects may be presented while the devices are housed within the active packaging.

17 Claims, 24 Drawing Sheets

Related U.S. Application Data continuation of application No. 14/179,459, filed on Feb. 12, 2014, now Pat. No. 9,371,155, which is a continuation of application No. 13/766,538, filed on Feb. 13, 2013, now Pat. No. 8,668,519, which is a continuation of application No. 13/323,751, filed on Dec. 12, 2011, now Pat. No. 8,376,776, which is a division of application No. 12/008,042, filed on Jan. 7, 2008, now Pat. No. 8,092,251.

(60) Provisional application No. 61/017,569, filed on Dec. 29, 2007.

(51) Int. Cl.
*H04B 7/26* (2006.01)
*H02J 50/80* (2016.01)
*B65D 75/56* (2006.01)

(56) References Cited

U.S. PATENT DOCUMENTS

| | | | |
|---|---|---|---|
| 4,277,842 A | 7/1981 | Richards | |
| 4,409,615 A * | 10/1983 | McMann, Jr. | H04N 5/3205 348/E5.089 |
| 4,735,576 A * | 4/1988 | Tanaka | H01R 13/533 439/686 |
| 4,830,181 A | 5/1989 | Hartman | |
| 5,091,713 A * | 2/1992 | Horne | G07F 5/18 340/541 |
| 5,115,888 A * | 5/1992 | Schneider | A47F 9/048 186/61 |
| 5,448,226 A * | 9/1995 | Failing, Jr. | G06K 17/0022 235/383 |
| 5,451,818 A * | 9/1995 | Chan | H01L 23/66 257/701 |
| 5,479,479 A * | 12/1995 | Braitberg | H02J 7/0004 370/271 |
| 5,555,156 A * | 9/1996 | Decante | E05B 65/0075 340/5.74 |
| 5,608,449 A * | 3/1997 | Swafford, Jr. | H04N 7/17318 348/E7.071 |
| 5,659,888 A | 8/1997 | Kato et al. | |
| 5,675,321 A * | 10/1997 | McBride | G08B 13/1409 340/568.2 |
| 5,703,564 A * | 12/1997 | Begum | G09F 19/02 340/815.4 |
| 5,706,179 A * | 1/1998 | Palatov | G06F 1/18 361/726 |
| 5,715,160 A * | 2/1998 | Plotke | G05B 19/42 482/900 |
| 5,822,184 A * | 10/1998 | Rabinovitz | G11B 33/126 361/679.31 |
| 5,842,629 A * | 12/1998 | Sprague | B65D 27/04 229/71 |
| 5,871,108 A * | 2/1999 | White | A47F 5/10 108/108 |
| 5,890,594 A * | 4/1999 | Hansen | B65D 75/245 206/216 |
| 5,910,653 A * | 6/1999 | Campo | G06F 3/147 250/205 |
| 5,924,663 A * | 7/1999 | Gatto | A47F 5/101 248/231.71 |
| 6,016,481 A * | 1/2000 | Failing, Jr. | G06Q 40/12 705/28 |
| 6,062,424 A * | 5/2000 | Simile-Gravina | A47F 1/08 206/746 |
| 6,070,956 A * | 6/2000 | Yates | A47B 21/00 312/194 |
| 6,108,198 A * | 8/2000 | Lin | G06F 1/181 312/223.1 |
| 6,144,561 A * | 11/2000 | Cannella, Jr. | H05K 7/1447 361/788 |
| 6,150,810 A * | 11/2000 | Roybal | G01V 3/087 324/226 |
| 6,208,867 B1 | 3/2001 | Kobayashi | |
| 6,215,656 B1 * | 4/2001 | O'Neal | G06F 1/183 361/679.02 |
| 6,288,333 B1 * | 9/2001 | Liu | G06F 1/18 174/563 |
| 6,292,890 B1 * | 9/2001 | Crisan | G06F 9/4408 709/220 |
| 6,310,549 B1 * | 10/2001 | Loftin | G08B 13/08 324/207.21 |
| 6,324,380 B1 * | 11/2001 | Kiuchi | H01Q 1/243 455/12.1 |
| 6,356,196 B1 * | 3/2002 | Wong | G08B 13/1427 340/539.1 |
| 6,363,254 B1 * | 3/2002 | Jones | G01S 5/0027 455/456.1 |
| 6,375,238 B1 * | 4/2002 | Hopkins | A47F 13/08 294/24 |
| 6,428,181 B1 * | 8/2002 | Moriarty | B25H 3/02 362/154 |
| 6,527,610 B1 * | 3/2003 | Hornsby | G04G 9/0064 368/10 |
| 6,554,131 B1 * | 4/2003 | Findle | B65D 73/0064 206/296 |
| 6,587,835 B1 * | 7/2003 | Treyz | G06Q 20/12 705/14.64 |
| 6,648,661 B1 * | 11/2003 | Byrne | G06F 1/1632 439/188 |
| 6,683,469 B2 * | 1/2004 | Lee | G01R 29/26 324/762.02 |
| 6,692,311 B1 * | 2/2004 | Kamei | H01R 9/2458 439/218 |
| 6,700,488 B1 * | 3/2004 | Leyden | G08B 13/1463 340/568.1 |
| 6,710,246 B1 * | 3/2004 | Mostafazadeh | H01L 21/561 174/528 |
| 6,711,002 B1 * | 3/2004 | Fan | G06F 1/181 312/223.3 |
| 6,720,990 B1 * | 4/2004 | Walker | G06Q 30/06 348/143 |
| 6,766,952 B2 * | 7/2004 | Luu | G06K 7/0034 235/451 |
| 6,828,909 B2 * | 12/2004 | Script | G08B 13/08 340/5.8 |
| 6,832,373 B2 | 12/2004 | O'Neill | |
| 6,868,803 B1 * | 3/2005 | Little | A01K 1/033 119/482 |
| 6,882,275 B2 * | 4/2005 | Blanpain | G08B 13/1436 324/247 |
| 6,901,304 B2 * | 5/2005 | Swan | G06Q 10/08 700/115 |
| 6,938,867 B2 * | 9/2005 | Dirks | H01R 13/72 248/309.1 |
| 6,945,828 B2 * | 9/2005 | Kamei | H01R 9/2458 439/218 |
| 6,946,961 B2 * | 9/2005 | Frederiksen | G08B 13/1445 340/548 |
| 6,975,888 B2 * | 12/2005 | Buesseler | H04B 1/3833 455/550.1 |
| 7,003,128 B2 * | 2/2006 | Boonen | H04R 25/30 381/322 |
| 7,031,692 B1 | 4/2006 | Zanzi | |
| 7,047,709 B2 * | 5/2006 | Hamilton | B65B 3/16 53/250 |
| 7,053,774 B2 * | 5/2006 | Sedon | A47F 7/024 206/807 |
| D527,176 S | 8/2006 | Andre et al. | |
| 7,088,964 B2 * | 8/2006 | O | H01Q 1/38 257/725 |
| 7,135,972 B2 * | 11/2006 | Bonato | A47F 7/024 340/568.2 |
| D533,348 S | 12/2006 | Andre et al. | |
| 7,158,022 B2 * | 1/2007 | Fallon | G08B 13/19656 340/505 |

(56) References Cited

U.S. PATENT DOCUMENTS

| | | | |
|---|---|---|---|
| 7,206,618 B2* | 4/2007 | Latto | H04M 1/0283 455/575.8 |
| 7,209,038 B1* | 4/2007 | Deconinck | G08B 13/1409 340/541 |
| 7,242,359 B2* | 7/2007 | Turner | H01Q 1/36 343/742 |
| 7,283,810 B1* | 10/2007 | Arakawa | G08C 17/02 340/438 |
| 7,327,276 B1* | 2/2008 | Deconinck | G08B 13/1409 340/568.8 |
| 7,328,333 B2* | 2/2008 | Kawano | G06F 1/24 713/1 |
| 7,356,495 B2* | 4/2008 | Beigl | G06K 7/10336 705/28 |
| 7,356,952 B2* | 4/2008 | Sweeney | H02J 50/05 40/446 |
| 7,370,983 B2 | 5/2008 | De Wind et al. | |
| 7,450,538 B2* | 11/2008 | Apneseth | G05B 19/414 370/322 |
| D582,405 S* | 12/2008 | Andre | D3/299 |
| 7,480,907 B1* | 1/2009 | Marolia | G06F 8/65 717/127 |
| 7,535,337 B2* | 5/2009 | Overhultz | G06Q 10/087 235/383 |
| 7,592,910 B2* | 9/2009 | Tuck | C11D 3/50 340/326 |
| 7,640,209 B1* | 12/2009 | Brooks | G06Q 40/025 705/38 |
| 7,649,456 B2 | 1/2010 | Wakefield et al. | |
| 7,650,007 B2 | 1/2010 | Iullis et al. | |
| 7,670,224 B2* | 3/2010 | Williams | G07F 17/32 463/24 |
| 7,710,266 B2* | 5/2010 | Belden, Jr. | A47F 7/024 340/568.2 |
| 7,778,023 B1 | 8/2010 | Mohoney | |
| 7,893,826 B2* | 2/2011 | Stenlund | B60R 25/33 340/521 |
| 7,944,368 B2* | 5/2011 | Carter | B60T 7/16 340/426.11 |
| 8,014,738 B2* | 9/2011 | Camuffo | H04B 1/0475 330/279 |
| 8,054,631 B2* | 11/2011 | Abrams | G06F 1/20 361/724 |
| 8,092,251 B2* | 1/2012 | Rosenblatt | B65D 25/02 439/536 |
| 8,102,262 B2* | 1/2012 | Irmscher | A47F 3/002 340/568.1 |
| 8,145,159 B2* | 3/2012 | Camuffo | H04B 1/0475 455/126 |
| 8,228,670 B2* | 7/2012 | Fahey | G06F 1/1632 312/223.1 |
| 8,231,017 B2* | 7/2012 | Clontz | A47F 5/0043 211/134 |
| 8,314,699 B2* | 11/2012 | Irmscher | A47F 3/002 340/562 |
| 8,321,302 B2* | 11/2012 | Bauer | G06K 7/0008 705/28 |
| 8,376,776 B2* | 2/2013 | Rosenblatt | H02J 50/20 439/536 |
| 8,379,874 B1* | 2/2013 | Simon | H04R 27/00 381/1 |
| 8,410,922 B2* | 4/2013 | Null | G08B 29/183 340/523 |
| 8,429,287 B2* | 4/2013 | Sullivan | H04N 7/24 370/213 |
| 8,508,540 B2* | 8/2013 | Porwal | G06F 1/3203 345/520 |
| 8,531,493 B2* | 9/2013 | Hui | G09G 3/2022 345/108 |
| 8,577,053 B1* | 11/2013 | Simon | H04R 27/00 381/77 |
| 8,595,811 B2* | 11/2013 | Johnson | G06Q 30/02 726/9 |
| 8,620,241 B2* | 12/2013 | Camuffo | H04B 1/0475 455/127.1 |
| 8,624,737 B2* | 1/2014 | Irmscher | A47F 3/002 340/562 |
| 8,639,214 B1* | 1/2014 | Fujisaki | G06Q 20/32 379/88.03 |
| 8,650,073 B2* | 2/2014 | Littman | G06Q 30/0261 705/14.1 |
| 8,668,519 B2* | 3/2014 | Rosenblatt | B65D 25/02 439/536 |
| 8,712,394 B2* | 4/2014 | Bos | H04W 8/245 455/418 |
| 8,742,686 B2* | 6/2014 | Zampini, II | H05B 33/0857 257/13 |
| 8,810,655 B2* | 8/2014 | McQueen | G08B 13/19619 340/568.1 |
| 8,898,633 B2* | 11/2014 | Bryant | G05B 19/056 717/106 |
| 8,934,226 B2* | 1/2015 | Smith | G06F 1/1613 361/679.2 |
| 9,089,059 B1* | 7/2015 | Haskin | G06F 1/1626 |
| 9,183,572 B2* | 11/2015 | Brubaker | G06Q 30/02 |
| 9,371,155 B2* | 6/2016 | Rosenblatt | B65D 25/02 |
| 9,443,404 B2* | 9/2016 | Grant | G08B 13/1445 |
| 9,537,347 B2* | 1/2017 | Ojala | H04W 8/245 |
| 9,560,922 B2* | 2/2017 | Wunner | A47F 5/0043 |
| 9,569,942 B2* | 2/2017 | Richter | G08B 13/149 |
| 9,600,959 B2* | 3/2017 | Lutnick | G07F 17/32 |
| 9,706,857 B2* | 7/2017 | Hardy | A47F 1/12 |
| 9,746,881 B2* | 8/2017 | Owens, Jr. | G06F 1/1632 |
| 9,747,613 B2* | 8/2017 | Rajan | G06Q 30/0225 |
| 9,754,444 B2* | 9/2017 | Lutnick | G07F 17/3227 |
| 9,805,539 B2* | 10/2017 | Swafford, Jr. | A47F 1/126 |
| 9,818,254 B2* | 11/2017 | Lutnick | G07F 17/32 |
| 9,881,327 B2* | 1/2018 | Sweeney | G06Q 30/0241 |
| 10,043,360 B1* | 8/2018 | Mullins | G08B 29/188 |
| 10,131,466 B2* | 11/2018 | Rosenblatt | B65D 75/566 |
| 10,186,124 B1* | 1/2019 | Mullins | G08B 13/19682 |
| 2001/0032797 A1* | 10/2001 | Kreider | B65D 21/086 206/461 |
| 2002/0024353 A1* | 2/2002 | Lee | G01R 29/26 324/762.02 |
| 2002/0026549 A1* | 2/2002 | Powers | H04L 41/083 710/104 |
| 2002/0040389 A1* | 4/2002 | Gerba | H04L 29/06027 709/219 |
| 2002/0139853 A1* | 10/2002 | Tsikos | B82Y 15/00 235/462.01 |
| 2002/0145042 A1* | 10/2002 | Knowles | B82Y 15/00 235/462.01 |
| 2002/0153422 A1* | 10/2002 | Tsikos | G06K 7/10742 235/454 |
| 2003/0011477 A1* | 1/2003 | Clapper | G06Q 10/06 340/573.1 |
| 2003/0019931 A1* | 1/2003 | Tsikos | G02B 26/10 235/454 |
| 2003/0033450 A1* | 2/2003 | Appleby-Alis | G06F 15/7867 710/8 |
| 2003/0040957 A1* | 2/2003 | Rodriguez | G06T 1/0021 705/14.26 |
| 2003/0042303 A1* | 3/2003 | Tsikos | G06K 7/10594 235/384 |
| 2003/0076229 A1* | 4/2003 | Blanpain | G08B 13/1436 340/551 |
| 2003/0085275 A1* | 5/2003 | Barkan | G06Q 20/387 235/383 |
| 2003/0107460 A1 | 6/2003 | Huang | |
| 2003/0107492 A1* | 6/2003 | Lin | G08B 3/10 340/691.6 |
| 2003/0115096 A1* | 6/2003 | Reynolds | G06Q 30/02 705/14.58 |
| 2003/0127878 A1* | 7/2003 | Gort | B60R 11/00 296/37.8 |
| 2003/0130567 A1* | 7/2003 | Mault | A61B 5/0022 600/300 |

(56) References Cited

U.S. PATENT DOCUMENTS

| | | | |
|---|---|---|---|
| 2003/0132854 A1* | 7/2003 | Swan | G06Q 10/08 340/8.1 |
| 2003/0142074 A1* | 7/2003 | Yang | G06F 3/0346 345/161 |
| 2003/0146282 A1* | 8/2003 | Tsikos | B82Y 15/00 235/454 |
| 2003/0182190 A1* | 9/2003 | Bergerioux | G06Q 30/02 705/14.39 |
| 2003/0216969 A1* | 11/2003 | Bauer | G06K 7/0008 705/22 |
| 2003/0222762 A1* | 12/2003 | Beigl | G06K 7/10336 340/5.92 |
| 2003/0233288 A1* | 12/2003 | Sweeney | G06Q 10/087 705/28 |
| 2004/0008157 A1* | 1/2004 | Brubaker | G02B 27/017 345/8 |
| 2004/0017300 A1* | 1/2004 | Kotzin | G08B 21/0453 340/870.11 |
| 2004/0025475 A1* | 2/2004 | Hamilton | B65B 3/16 53/440 |
| 2004/0069920 A1* | 4/2004 | Dirks | H01R 13/72 248/316.7 |
| 2004/0087335 A1* | 5/2004 | Peiker | B60R 11/0241 455/556.2 |
| 2004/0089579 A1* | 5/2004 | Berliner | B65D 21/0204 206/499 |
| 2004/0142602 A1* | 7/2004 | Kamei | H01R 9/2458 439/700 |
| 2004/0163135 A1* | 8/2004 | Giaccherini | H04B 7/18523 725/136 |
| 2004/0211696 A1* | 10/2004 | Underhill | A61F 15/001 206/494 |
| 2005/0021561 A1* | 1/2005 | Noonan | G06Q 10/087 |
| 2005/0021578 A1* | 1/2005 | Chen | G06F 7/57 708/230 |
| 2005/0082371 A1* | 4/2005 | Schmidt | G06K 7/10 235/462.45 |
| 2005/0113673 A1* | 5/2005 | Avinash | A61B 5/055 600/413 |
| 2005/0128093 A1* | 6/2005 | Genova | G08B 17/12 340/577 |
| 2005/0150949 A1* | 7/2005 | Goel | G06K 19/0701 235/383 |
| 2005/0173605 A1* | 8/2005 | Villeneuve | A47F 5/0018 248/301 |
| 2005/0190072 A1* | 9/2005 | Brown | G06Q 10/087 340/6.1 |
| 2005/0195975 A1* | 9/2005 | Kawakita | H04L 9/0822 380/30 |
| 2005/0222801 A1* | 10/2005 | Wulff | G01P 1/127 702/141 |
| 2005/0231983 A1* | 10/2005 | Dahm | A61C 19/003 362/294 |
| 2005/0240919 A1* | 10/2005 | Kim | G06F 8/65 717/168 |
| 2005/0243522 A1* | 11/2005 | Nilsen | H04M 1/04 361/716 |
| 2006/0036505 A1* | 2/2006 | Jakubaitis | G06Q 30/06 705/26.1 |
| 2006/0038731 A1* | 2/2006 | Turner | H01Q 1/36 343/742 |
| 2006/0042135 A1* | 3/2006 | Hermanson | B42D 15/022 40/124.03 |
| 2006/0103532 A1* | 5/2006 | Van Fleet | G06K 7/10178 340/572.1 |
| 2006/0165026 A1* | 7/2006 | Apneseth | G05B 19/414 370/322 |
| 2006/0166737 A1* | 7/2006 | Bentley | A63F 13/428 463/30 |
| 2006/0271773 A1* | 11/2006 | Marquiz | G06F 11/0748 713/1 |
| 2006/0291146 A1* | 12/2006 | Madsen | A45C 11/00 361/600 |
| 2007/0015503 A1* | 1/2007 | Choi | H04M 1/72519 455/425 |
| 2007/0022644 A1* | 2/2007 | Lynch | A47B 13/08 40/446 |
| 2007/0035380 A1* | 2/2007 | Overhultz | G06Q 10/087 340/5.9 |
| 2007/0050305 A1* | 3/2007 | Klein | G06Q 10/06 705/67 |
| 2007/0053523 A1* | 3/2007 | Iuliis | A45F 5/00 381/77 |
| 2007/0056872 A1* | 3/2007 | Begim | B65D 73/0057 206/461 |
| 2007/0061860 A1* | 3/2007 | Walker | H04L 63/10 725/117 |
| 2007/0069892 A1* | 3/2007 | Paul | G08B 13/10 340/539.17 |
| 2007/0069901 A1* | 3/2007 | Tuck | C11D 3/50 340/573.1 |
| 2007/0073585 A1* | 3/2007 | Apple | G06O 30/02 705/14.46 |
| 2007/0075965 A1* | 4/2007 | Huppi | H04M 1/72563 345/156 |
| 2007/0078944 A1* | 4/2007 | Charlebois | H04N 21/235 709/217 |
| 2007/0081076 A1* | 4/2007 | Leichter | H04N 7/142 348/14.16 |
| 2007/0109103 A1* | 5/2007 | Jedrey | G06Q 10/087 340/10.5 |
| 2007/0143179 A1* | 6/2007 | Eyal | G06Q 30/00 705/14.41 |
| 2007/0150886 A1* | 6/2007 | Shapiro | G06F 8/61 717/174 |
| 2007/0163122 A1* | 7/2007 | Grosh | B26B 1/08 30/2 |
| 2007/0183512 A1* | 8/2007 | Li | H04N 5/4401 375/240.27 |
| 2007/0228095 A1* | 10/2007 | Cullmann | B60R 11/0241 224/570 |
| 2007/0229259 A1* | 10/2007 | Irmscher | A47F 7/024 340/568.2 |
| 2007/0247800 A1* | 10/2007 | Smith | B60R 11/0252 361/679.02 |
| 2007/0270663 A1 | 11/2007 | Ng et al. | |
| 2007/0271116 A1 | 11/2007 | Wysocki et al. | |
| 2007/0271143 A1* | 11/2007 | Dooley | G06Q 20/20 705/14.1 |
| 2007/0279885 A1* | 12/2007 | Basavanhally | B81B 7/0051 361/799 |
| 2007/0285385 A1* | 12/2007 | Albert | G06F 3/147 345/107 |
| 2007/0295749 A1* | 12/2007 | Holzwarth | B65D 33/14 222/107 |
| 2008/0011825 A1* | 1/2008 | Giordano | G06Q 20/04 235/380 |
| 2008/0030427 A1* | 2/2008 | Lanham | G09F 21/06 345/2.3 |
| 2008/0036591 A1* | 2/2008 | Ray | H04M 1/72569 340/540 |
| 2008/0042530 A1* | 2/2008 | Hawkins | A47B 45/00 312/199 |
| 2008/0048838 A1* | 2/2008 | Montgomery | G06K 17/0003 340/10.51 |
| 2008/0077422 A1* | 3/2008 | Dooley | G06Q 30/02 705/26.1 |
| 2008/0102767 A1* | 5/2008 | Camuffo | H04B 1/0475 455/127.1 |
| 2008/0111685 A1* | 5/2008 | Olson | B65D 55/028 340/545.6 |
| 2008/0127065 A1* | 5/2008 | Bryant | G05B 19/056 717/109 |
| 2008/0139306 A1* | 6/2008 | Lutnick | G07F 17/3227 463/30 |
| 2008/0157209 A1* | 7/2008 | Sutardja | H01L 23/5386 257/368 |

(56) References Cited

U.S. PATENT DOCUMENTS

| | | | |
|---|---|---|---|
| 2008/0158268 A1* | 7/2008 | Hui | G09G 3/2022 345/691 |
| 2008/0167106 A1* | 7/2008 | Lutnick | G07F 17/32 463/16 |
| 2008/0202003 A1* | 8/2008 | Sweeney | G06Q 10/087 40/446 |
| 2008/0212971 A1* | 9/2008 | Shaanan | H04B 10/1141 398/130 |
| 2008/0230439 A1* | 9/2008 | Abrams | G06F 1/18 206/723 |
| 2008/0231714 A1* | 9/2008 | Estevez | G03B 17/00 348/208.16 |
| 2008/0235108 A1* | 9/2008 | Kulakowski | G06Q 10/02 705/5 |
| 2008/0267639 A1* | 10/2008 | Totsuka | G03G 15/6511 399/23 |
| 2008/0278320 A1* | 11/2008 | Soto | G08B 13/248 340/541 |
| 2008/0278321 A1* | 11/2008 | McQueen | G08B 13/19619 340/568.1 |
| 2008/0294487 A1* | 11/2008 | Nasser | G06Q 30/02 705/7.32 |
| 2008/0303681 A1* | 12/2008 | Herz | G06F 1/1616 340/671 |
| 2009/0061884 A1* | 3/2009 | Rajan | G06Q 30/0225 455/445 |
| 2009/0066782 A1* | 3/2009 | Choi | H04N 3/155 348/25 |
| 2009/0085500 A1* | 4/2009 | Zampini, II | H05B 33/0857 315/297 |
| 2009/0090037 A1* | 4/2009 | Arndt | A47F 5/0823 40/642.01 |
| 2009/0093785 A1* | 4/2009 | Brown | G01D 9/005 604/404 |
| 2009/0125442 A1* | 5/2009 | Otto | G06Q 20/04 705/39 |
| 2009/0156172 A1* | 6/2009 | Chan | H04M 1/72566 455/412.2 |
| 2009/0168088 A1* | 7/2009 | Rosenblatt | G06F 1/1632 358/1.12 |
| 2009/0299857 A1* | 12/2009 | Brubaker | G06Q 30/02 705/14.66 |
| 2009/0305748 A1 | 12/2009 | Piekarz | |
| 2010/0012600 A1* | 1/2010 | Clontz | A47B 96/02 211/26 |
| 2010/0026187 A1* | 2/2010 | Kelly | A47F 11/10 315/113 |
| 2010/0036288 A1* | 2/2010 | Lanfermann | A41D 13/1281 600/595 |
| 2010/0056886 A1* | 3/2010 | Hurtubise | A61B 5/0205 600/324 |
| 2010/0078343 A1 | 4/2010 | Hoellwarth et al. | |
| 2010/0114783 A1* | 5/2010 | Spolar | G06Q 30/02 705/80 |
| 2010/0115571 A1* | 5/2010 | Binder | H04L 65/60 725/110 |
| 2010/0134964 A1* | 6/2010 | Smith | B60R 11/0252 361/679.2 |
| 2010/0156605 A1* | 6/2010 | Saxena | G09F 3/204 340/10.3 |
| 2010/0188222 A1* | 7/2010 | Irmscher | A47F 7/024 340/568.2 |
| 2010/0194568 A1* | 8/2010 | Irmscher | A47F 3/002 340/568.3 |
| 2010/0218465 A1* | 9/2010 | Takaya | G06Q 30/02 53/467 |
| 2010/0281178 A1* | 11/2010 | Sullivan | H04N 7/24 709/231 |
| 2010/0332356 A1* | 12/2010 | Spolar | G06Q 30/02 705/27.1 |
| 2011/0001827 A1* | 1/2011 | Ortiz | G07C 9/00087 348/156 |
| 2011/0047600 A1* | 2/2011 | Johnson | G06Q 30/02 726/4 |
| 2011/0090626 A1 | 4/2011 | Hoellwarth et al. | |
| 2011/0168443 A1* | 7/2011 | Smolka | E21B 7/14 175/15 |
| 2011/0205376 A1* | 8/2011 | Wulff | G01P 1/127 348/208.2 |
| 2011/0273852 A1 | 11/2011 | Debrody et al. | |
| 2011/0280282 A1* | 11/2011 | Camuffo | H04B 1/0475 375/133 |
| 2011/0320278 A1* | 12/2011 | Littman | G06Q 30/02 705/14.58 |
| 2012/0009454 A1* | 1/2012 | Hirano | G07C 9/00944 429/100 |
| 2012/0032802 A1* | 2/2012 | Irmscher | A47F 3/002 340/568.2 |
| 2012/0066168 A1* | 3/2012 | Fadell | G05B 15/02 706/52 |
| 2012/0081213 A1* | 4/2012 | Rosenblatt | H04B 7/26 340/10.34 |
| 2012/0149442 A1* | 6/2012 | Camuffo | H04B 1/0475 455/571 |
| 2012/0190452 A1* | 7/2012 | Weston | A63F 13/98 463/39 |
| 2012/0255469 A1* | 10/2012 | Schilling | E04H 9/029 109/1 S |
| 2013/0005447 A1* | 1/2013 | Lutnick | G07F 17/32 463/25 |
| 2013/0006773 A1* | 1/2013 | Lutnick | G07F 17/32 705/14.58 |
| 2013/0049961 A1* | 2/2013 | Irmscher | A47F 3/002 340/568.3 |
| 2013/0194062 A1* | 8/2013 | Rosenblatt | H02J 50/80 340/4.3 |
| 2014/0094320 A1* | 4/2014 | Johnson | G06Q 30/02 463/43 |
| 2014/0157698 A1* | 6/2014 | Cihak | E04H 5/08 52/234 |
| 2014/0180914 A1* | 6/2014 | Abhyanker | G01C 1/00 705/39 |
| 2014/0190913 A1* | 7/2014 | Hardy | A47F 1/12 211/59.3 |
| 2014/0274175 A1* | 9/2014 | Rosenblatt | H03K 17/94 455/500 |
| 2014/0307439 A1* | 10/2014 | Chien | H02J 7/0042 362/253 |
| 2015/0190085 A1* | 7/2015 | Nathan | A61B 5/1107 600/595 |
| 2015/0232248 A1* | 8/2015 | Smith | B65D 73/0078 206/307 |
| 2016/0063492 A1* | 3/2016 | Kobres | G06K 9/00288 705/16 |
| 2016/0140614 A1* | 5/2016 | Brubaker | G06Q 30/02 705/14.46 |
| 2016/0166470 A1* | 6/2016 | Tobescu | G06K 19/07798 340/691.6 |
| 2016/0199693 A1* | 7/2016 | Vermilyea | A61B 5/6831 700/91 |
| 2016/0295173 A1* | 10/2016 | Gredinger | H04N 5/2256 |
| 2016/0347504 A1* | 12/2016 | Rosenblatt | H03K 17/94 |
| 2017/0057423 A1* | 3/2017 | Wang | B60R 11/04 |
| 2017/0236401 A1* | 8/2017 | Fawcett | G08B 13/1445 340/501 |
| 2017/0262471 A1* | 9/2017 | Schloter | G01C 21/3476 |
| 2018/0089938 A1* | 3/2018 | Lutnick | G07F 17/32 |
| 2019/0084723 A1* | 3/2019 | Rosenblatt | B65D 75/566 |

* cited by examiner

| Serial No. | Firmware Updates | Application Updates | Content |
|---|---|---|---|
| 4214101SLG6 | 1.01C | mplayer31a -ui | Hip Hop Package |
| 2232084SLG6 | 1.01B | iLife_patch302b -u | Dance Package |
| 5977171SLG6 | 1.01C | | Best of Garth Brooks |

FIG. 11

ACTIVE ELECTRONIC MEDIA DEVICE PACKAGING

CROSS-REFERENCES TO RELATED APPLICATIONS

This application is a continuation of U.S. patent application Ser. No. 15/187,341, filed Jun. 20, 2016, which is a continuation of U.S. patent application Ser. No. 14/179,459, filed Feb. 12, 2014, which is a continuation of U.S. patent application Ser. No. 13/766,538, filed Feb. 13, 2013, which is a continuation of U.S. patent application Ser. No. 13/323,751, filed Dec. 12, 2011, which is a divisional of U.S. patent application Ser. No. 12/008,042, filed Jan. 7, 2008, which claims the benefit of U.S. Provisional Patent Application No. 61/017,569, filed Dec. 29, 2007. Each of these applications is incorporated herein in its entirety by reference thereto.

BACKGROUND

Embodiments of this invention relate generally to electronic media devices, and, more particularly, to active packaging for electronic media devices that allows power, data, or both power and data to be supplied to one or more electronic devices housed within the active packaging.

Traditional packaging for an electronic media device includes plastic or cardboard containers and boxes that house the electronic media device. The outside of the container or box is typically printed with various labels, advertising, device specifications, and other useful information that allows the consumer to make an informed decision whether or not to purchase the electronic media device. For example, compatibility information, the hardware or software requirements of the electronic device, and information about accessories for the electronic media device may all be printed on the outside of the device packaging.

The inside of the device packaging is typically designed to securely house the electronic media device. The main design consideration for the inside of electronic device packaging may be to prevent damage to the device during shipping, storage, or consumer handling. For example, styrofoam or polystyrene insulation or beads may be included within the packaging to help insulate the electronic media device from shock. Other protective measures, such as air cellular cushioning, polyethylene fabrication foams, and various forms of suspension or retention packaging, may also be used in some packaging designs. For example, a highly resilient, low-slip film may be used to encase the electronic media device (particularly portable electronic media devices) to prevent or reduce shock and vibration.

Although typical packaging for an electronic media device may be designed to adequately protect the device from shock or damage, the packaging is extremely limited in other respects. For example, the ability to fully view or interact with the electronic media device while still inside the packaging is severely limited in most packaging designs. Although unobtrusive packaging designs have been developed, these designs typically do not allow the electronic media device to be interacted with while inside the packaging.

In addition, typical packaging designs do not enable the electronic media device or devices housed within the packaging to present content (e.g., media content or advertising) while inside the packaging and without draining battery power. Other functionality, such as firmware or software upgrades, are also typically not available while the electronic media device is housed within the product packaging (e.g., at a retail location). This is primarily due to the inability to provide external power or data to the device while still housed within the packaging.

BRIEF SUMMARY

In view of the foregoing, active packaging for electronic media devices is provided. The active packaging may provide power, data, or both power and data to one or more electronic media devices housed within the packaging. The power may be provided by a direct power connection to an external power supply or by one or more wireless power techniques. A data signal may be provided by one or more direct data lines to the electronic media device within the packaging, or the electronic media device may enable an integrated wireless network interface to receive a data stream while housed in the packaging. The data signal may include promotional information (e.g., advertising) or media content (e.g., digital audio or video content) for presentation on the electronic media device while inside the active packaging. The data signal may also include firmware or software updates, bug fixes, or application customizations to be applied to the electronic media device.

In some embodiments, one or more electronic media devices are housed in an encasing that is at least partially transparent. The encasing may be formed from any type of plastic or polymer, and may include, for example, any thermoplastic, thermoset, acrylic fiber, synthetic resin, styrene, or other suitable material. For example, the material forming the encasing may include a thermoplastic or thermosetting polymer with a high melting point. In some embodiments, red phosphorous may be incorporated into the polymer to improve its flame-retardant properties and increase its melting point.

The encasing may allow for at least the display portion of the electronic media device to be viewed from the outside of the encasing. For example, the encasing may take the form of a rigid or flexible plastic sleeve or any other type of container. Pull tabs may also be included on at least one perimeter portion of the encasing to allow for easy removal of the electronic device from the encasing. In some embodiments, the encasing may also be configured to securely hold the electronic media device until the encasing is bent slightly convex, at which point the electronic media device may be easily removed from the encasing.

In some embodiments, a plastic (or any other suitable polymer) backing is used instead of, or in addition to, the encasing. The backing may include one or more clasps or hooks that secure the electronic media device to the backing. In some embodiments, the backing is rigid, but may be bent slightly in the convex direction to release the electronic media device. For example, a consumer may gently press the top and bottom portions of the backing in order to bend each of the top and bottom portions of the backing five to fifteen degrees. After bending the backing, one or more of the clasps or hooks may release the electronic media device, allowing the device to be freely removed from the backing.

The backing may be printed (or in-molded) with one or more wire traces to supply power, ground, and data to the device. In some embodiments, the wire traces are routed to the appropriate pins or connectors on the electronic media device through the hooks or clasps that hold the device onto the backing. For example, one hook or connector may interface with a dock connector interface (or other suitable interface) on the electronic media device. The dock connector may include four pins to communicate over a Universal Serial Bus (USB) interface. One pin may be included for USB power (e.g., +5 VDC), one pin may be included for USB ground, one pin may be included for USB data (negative differential, for example, −3.3 VDC), and one pin may be included for USB data (positive differential, for example, +3.3 VDC). Any suitable number and types of wires or wire traces carrying any suitable types of signals may be used in other embodiments.

In some embodiments, the encasing may be inserted into an outer housing. The outer housing may include any suitable packaging, such as a plastic or cardboard case or container. Like the encasing, at least part of the outer housing may be transparent (or cut away) so that at least the display of the electronic media device within the inner encasing is visible from the exterior of the outer housing. The exterior of the outer housing, the backing, or the encasing may be printed with various types of information, such as advertisements, product specifications, and any other suitable information.

To provide power to the electronic media device or devices housed within the encasing, at least two wire traces may be printed onto or within the encasing or backing in some embodiments. In some embodiments, the wire traces may be in-molded into the encasing or backing instead of, or in addition to, printing the traces. The encasing or backing may also include at least two layers (e.g., at least two layers of plastic), and the wire traces may be printed between the at least two layers. The wires traces may be routed to the appropriate pins or connectors on the electronic media device that provide power to the device. One of the at least two wire traces may be power, and another of the at least two wire traces may be ground. At least one data signal may also be printed (or in-molded) onto or within the encasing or backing. The at least one data signal may be routed to the appropriate pins or connectors on the electronic media device for supplying data to the device.

Instead of, or in addition to, using direct power, the electronic media device may also be powered via magnetic induction or other wireless power techniques. The active packaging may include at least one antenna for receiving an RF signal from an RF power transmitter. The antenna may be external to the packaging or integrated with the packaging. The RF power transmitter may output an amplified continuous wave (CW) or pulsed RF signal. If a pulsed RF signal is used, each pulse of the pulsed RF signal may exhibit a different amplitude, which may vary over the duration of the pulse. As such, the amplitude may take several shapes over the duration of the pulse including, for example, a straight line, an increasing or decreasing ramp, a square-wave, a sine-wave, or any other suitable shape.

Non-resonant or resonant inductive coupling may also be used to transfer power from an external shared magnetic field to the active packaging. In some embodiments, one active package may be positioned near or stacked upon another active package in order to transfer energy using mutual electromagnetic induction. One active package may include the primary circuit of a transformer while another active package may include the secondary circuit of the transformer. In this way, multiple active packages may be stacked together (or positioned next to one another, for example, on a peg or product shelf) to transfer power through a chain of active packages. Each active package may power the next package via mutual induction.

In some embodiments, both direct power and electromagnetic induction are used to power a row or cluster of active packages. The last active package in the row or cluster (e.g., the package positioned to be picked up last by a purchasing consumer) may be directly powered by an external power source. The other packages in the row or cluster may then be powered by electromagnetic induction, an RF signal from an RF power transmitter, or any combination of the aforementioned power techniques.

The electronic media device may also include (or be attached to) at least one position, orientation, or movement (POM) sensor. The POM sensors may include, for example, single-axis or multi-axis accelerometers, angular rate or inertial sensors (e.g., optical gyroscopes, vibrating gyroscopes, gas rate gyroscopes, or ring gyroscopes), magnetometers (e.g., scalar or vector magnetometers), linear velocity sensors, RF triangulation detectors, proximity sensors (e.g., infrared or optical proximity sensors), motions sensors, and ambient light sensors (e.g., photoelectric sensors). After the device is powered, one or more of these POM sensors may determine the position or orientation of the electronic media device.

For example, using RF triangulation techniques, the device's approximate location may be determined using various measurements of the device's own network signal, such as: (1) the angle of the signal's approach to or from one or more wireless access points, (2) the amount of time for the signal to reach one or more wireless access points or the user's media device, (3) the strength of the signal when it reaches one or more wireless access points or the user's media device, or any combination of the aforementioned measurements.

RF fingerprinting may also be used to determine the location of the electronic media device. RF fingerprinting may compare the device's view of the network infrastructure (i.e., the strength of signals transmitted by infrastructure access points) with a database that contains an RF physical model of the coverage area. This database may be populated by either an extensive site survey or an RF prediction model of the coverage area.

Additionally or alternatively, the location of each electronic media device may transmitted via the data signal received by each active package. Pegged or stacked displays (e.g., in a retail location) may be organized on a grid structure with each stack or row of active packages being assigned the same coordinate location value. In grid mode, each stack or row may be individually addressable using a programmable switch or other suitable device. For example, an (x,y) coordinate system may be defined in some embodiments. In addition to sending location information to each electronic media device while in the active packaging, custom media content and advertising for display may also be transmitted to each electronic media device in a stack or row.

In some embodiments, only the electronic media device in the first active package in the stack or row may display custom media content and advertising. The displays of all other electronic media devices may be disabled. For example, after a POM sensor (e.g., an ambient light sensor or proximity sensor) determines that a device is the first device in a row or stack (i.e., the device visible to a consumer), this device may become the active device in that stack or row. In some embodiments, to determine which device is active in a stack or row, some threshold level of ambient light may be detected by an ambient light sensor integrated with or attached to the electronic media device. In other embodiments, some minimum distance to a nearby object may be detected by a proximity sensor (e.g., an optical or infrared proximity sensor) integrated with or attached to the electronic media device. In still other embodiments, the readings from both an ambient light sensor and a proximity sensor are used to determine which device is the active device in the stack or row.

The electronic media device at the front of each stack or row may continuously display content or only display content when the device detects some threshold level of motion. For example, a POM sensor (e.g., a multi-axis accelerometer) integrated with or attached to each electronic media device may detect movement or acceleration in one or more directions. After a sufficient movement event is detected (e.g., a consumer handling the active package), the device may automatically display advertising, media content, or a custom message to the consumer. If the active package is picked up and removed from the display unit, the next device in that stack or row may automatically become the active device for that stack or row. The new active device may then automatically begin presenting media content or advertising.

In grid mode, a variety of coordinated or synchronized display effects may be presented on a collection of electronic media devices. For example, a multiple-screen display of advertising or other media content spanning a collection of electronic media devices may be presented on the set of active devices in each stack or row (e.g., the device in each stack or row that is visible to consumers). Each device may display its portion of the advertising or media content based on its location within the grid.

Other coordinated or synchronized display effects may also be presented on a set of devices within a display unit. For example, a network controller or switch may randomly select one device from the set of devices to display media content or advertising. The device selected for display may be changed periodically, allowing for a random display effect among a set of devices. Alternatively, one device from the set of active devices may receive a token from the network controller. The token may indicate which device is currently active for display. After receiving the token, the device may automatically display media content or advertising for some predetermined length of time. The token may be passed to another device in the set of devices after the expiration of the predetermined length of time.

The display of a set of active devices (e.g., all the active devices in a display unit) may also be time synchronized in some embodiments. For example, each active electronic media device may periodically synchronize the presentation of media content or advertising with other devices. A synchronization routine executing on each active electronic media device may periodically enable a wireless interface (e.g., a Bluetooth interface) to synchronize each device's internal clock with the internal clocks of all other devices in a display unit. Alternatively, the internal clock of each device within a display unit may be synchronized with a network time server. A set of the electronic media devices within the same display unit may then be configured to display the same frame or portion of media content or advertising at the same time.

BRIEF DESCRIPTION OF THE DRAWINGS

The above and other advantages of embodiments of the present invention will be apparent upon consideration of the following detailed description, taken in conjunction with accompanying drawings, in which like reference characters refer to like parts throughout, and in which:

FIG. 11 shows an illustrative data table used to send media content and application updates to the electronic media devices in active packaging in accordance with one embodiment of the invention.

DETAILED DESCRIPTION

Embodiments of the active packaging of the present invention may be used to supply power, data, or both power and data to electronic media devices while the devices are housed within the active packaging. The active packaging may be suitable for retail display and consumer handling.

As used herein, an electronic media device may include any device with at least one electronic component that may be used to present human-perceivable media. Such devices may include, for example, portable music players (e.g., Apple's iPod devices), portable video players (e.g., portable DVD players), cellular telephones (e.g., Apple's iPhone devices), video cameras, digital still cameras, projection systems (e.g., holographic projection systems), gaming systems, PDAs, and mobile computers. Some of these devices may be configured to provide audio, video, or other sensory output.

Figure 1:
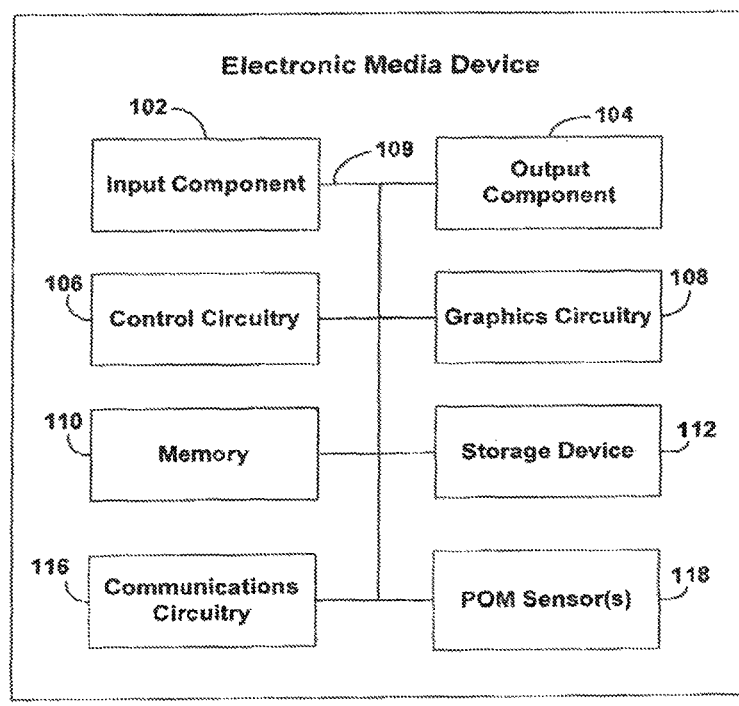
FIG. 1 is a simplified illustrative block diagram of an electronic media device in accordance with one embodiment of the invention.

FIG. 1 shows a simplified block diagram of illustrative electronic media device 100 which may be housed in the active packaging of embodiments of the present invention. Electronic media device 100 may include, among other components, one or more of user input component 102, output component 104, control circuitry 106, graphics circuitry 108, bus 109, memory 110, storage device 112, communications circuitry 116, and POM sensors 118. Electronic media device 100 may also include a rechargeable battery (e.g., a lithium-ion battery or lithium polymer cell, not shown) to provide power to the various components of electronic media device 100. Control circuitry 106 may communicate with the other components of electronic media device 100 (e.g., via bus 109) to control the operation of electronic media device 100. In some embodiments, control circuitry 106 may execute instructions stored in memory 110. Control circuitry 106 may also be operative to control the performance of electronic media device 100. Control circuitry 106 may include, for example, a processor, a microcontroller, and/or a bus (e.g., for sending instructions to the other components of electronic media device 100). In some embodiments, control circuitry 106 may also drive the display and process inputs received from input component 102.

Memory 110 may include one or more different types of memory that may be used to perform device functions. For example, memory 110 may include cache, flash memory, ROM, RAM, and/or hybrid types of memory. Memory 110 may also store firmware for the device and its applications (e.g., operating system, user interface functions, and processor functions).

Storage device 112 may include one or more suitable storage mediums or mechanisms, such as a magnetic hard drive, flash drive, tape drive, optical drive, permanent memory (such as ROM), semi-permanent memory (such as RAM), or cache. Storage device 112 may be used for storing media (e.g., audio and video files), text, pictures, graphics, advertising, or any suitable user-specific or global information that may be used by electronic media device 100. Storage device 112 may also store programs or applications that may run on control circuitry 106, may maintain files formatted to be read and edited by one or more of the applications, and may store any additional files that may aid the operation of one or more applications (e.g., files with metadata). It should be understood that any of the information stored on storage device 112 may instead be stored in memory 110.

With continuing reference to FIG. 1, electronic media device 100 may also include input component 102 and output component 104 for providing a user with the ability to interact with electronic media device 100. For example, input component 102 and output component 104 may provide an interface for a user to interact with an application running on control circuitry 106. Input component 102 may take a variety of forms, such as a keyboard/keypad, trackpad, mouse, click wheel, button, stylus, or touch screen. Input component 102 may also include one or more devices for user authentication (e.g., smart card reader, fingerprint reader, or iris scanner) as well as an audio input device (e.g., a microphone) or a video input device (e.g., a camera or a web cam) for recording video or still frames. Output component 104 may include any suitable display, such as a liquid crystal display (LCD) or a touch screen display, a projection device, a speaker, or any other suitable system for presenting information or media to a user. Output component 104 may be controlled by graphics circuitry 108. Graphics circuitry 108 may include a video card, such as a video card with 2D, 3D, or vector graphics capabilities. In some embodiments, output component 104 may also include an audio component that is remotely coupled to electronic media device 100. For example, output component 104 may include a headset, headphones, or earbuds that may be coupled to electronic media device 100 with a wire or wirelessly (e.g., Bluetooth headphones or a Bluetooth headset).

Electronic media device 100 may have one or more applications (e.g., software applications) stored on storage device 112 or in memory 110. Control circuitry 106 may be configured to execute instructions of the applications from memory 110. For example, control circuitry 106 may be configured to execute a media player application that causes full-motion video or audio to be presented or displayed on output component 104. Other applications resident on electronic media player 100 may include, for example, a telephony application, a GPS navigator application, a web browser application, and a calendar or organizer application. Electronic media device 100 may also execute any suitable operating system, such as a Windows or Mac OS, and can include a set of applications stored on storage device 112 or memory 110 that is compatible with the particular operating system.

The applications available to a user of electronic media device 100 may be grouped into application suites. The suites may include applications that provide similar or related functionalities. For example, the applications in one suite may include word processing and publishing applications (e.g., Keynote and Pages within the iWork suite), and another suite may include media editing tools (e.g., iWeb within the iLife suite). The applications within a given suite may have similar properties and other features that associate each application in a suite with the other applications in that suite. For example, the applications may feature a similar look and feel, may include a similar user interface, may include related features or functions, may allow a user to easily switch between the applications in the suite, or include any suitable combination of the foregoing.

In some embodiments, electronic media device 100 may also include communications circuitry 116 to connect to one or more communications networks. Communications circuitry 116 may be any suitable communications circuitry operative to connect to a communications network and to transmit communications (e.g., voice or data) from electronic media device 100 to other devices within the communications network. Communications circuitry 116 may be operative to interface with the communications network using any suitable communications protocol such as, for example, Wi-Fi (e.g., a 802.11 protocol), Bluetooth, high frequency systems (e.g., 900 MHz, 2.4 GHz, and 5.6 GHz communication systems), infrared, GSM, GSM plus EDGE, CDMA, quadband, and other cellular protocols, VoIP, or any other suitable protocol.

In some embodiments, communications circuitry 116 may be operative to create a communications network using any suitable communications protocol. Communications circuitry 116 may create a short-range communications network using a short-range communications protocol to connect to other devices. For example, communications circuitry 116 may be operative to create a local communications network using the Bluetooth protocol to couple with a Bluetooth headset (or any other Bluetooth device). Communications circuitry 116 may also include a wired or wireless network interface card (NIC) configured to connect to the Internet or any other public or private network.

For example, electronic media device 100 may be configured to connect to the Internet via a wireless network, such as a packet radio network, an RF network, a cellular network, or any other suitable type of network. Communication circuitry 116 may be used to initiate and conduct communications with other communications devices or media devices within a communications network.

Electronic media device 100 may also include any other component suitable for performing a communications operation. For example, electronic media device 100 may include a power supply, an antenna, ports or interfaces for coupling to a host device, a secondary input mechanism (e.g., an ON/OFF switch), or any other suitable component.

Electronic media device 100 may also include POM sensors 118. POM sensors 118 may be used to determine the approximate geographical or physical location (e.g., within a retail location) of electronic media device 100. As described in more detail below, the location of electronic media device 100 may be derived from any suitable trilateration or triangulation technique, in which case POM sensors 118 may include an RF triangulation detector or sensor, or any other location circuitry configured to determine the location of electronic media device 100.

POM sensors 118 may also include one or more sensors or circuitry for detecting the position, orientation, or movement of electronic media device 100. Such sensors and circuitry may include, for example, single-axis or multi-axis accelerometers, angular rate or inertial sensors (e.g., optical gyroscopes, vibrating gyroscopes, gas rate gyroscopes, or ring gyroscopes), magnetometers (e.g., scalar or vector magnetometers), ambient light sensors, proximity sensors, motion sensor (e.g., a passive infrared (PIR) sensor, active ultrasonic sensor, or active microwave sensor), and linear velocity sensors. For example, control circuitry 106 may be configured to read data from one or more of POM sensors 118 in order to determine the location, orientation, or velocity of electronic media device 100. One or more of POM sensors 118 may be positioned near output component 104 (e.g., above, below, or on either side of the display screen of electronic media device 100).

Figure 2A:
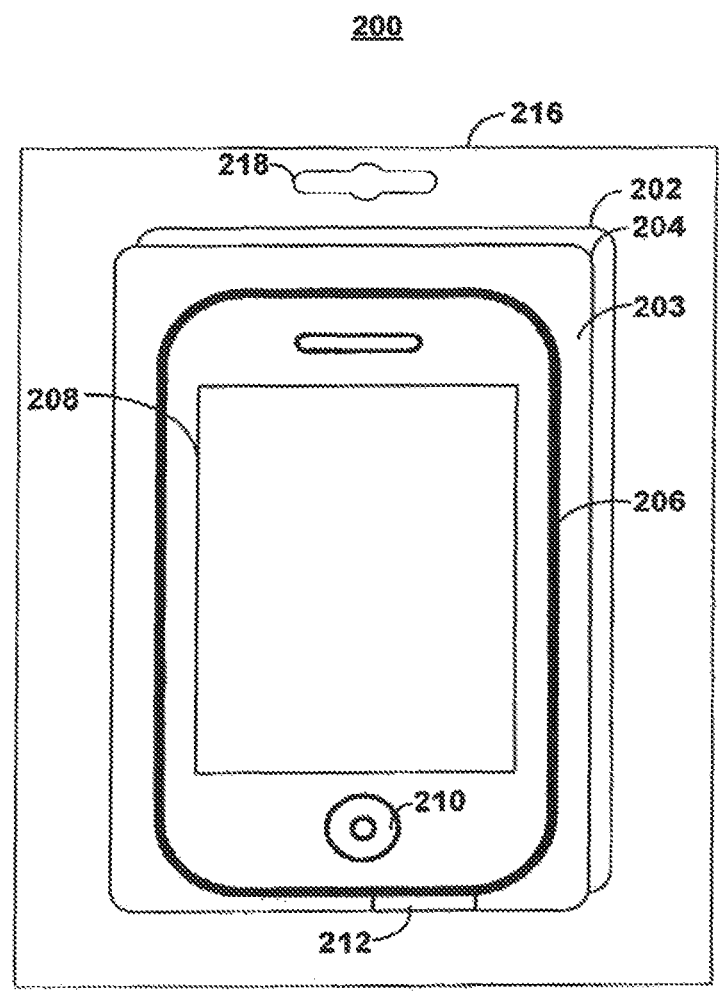
FIG. 2A shows a front view of an illustrative active package in accordance with one embodiment of the invention.

FIG. 2A shows illustrative active package 200 for housing electronic media device 206. Electronic media device 206 may include some or all of the components of electronic media device 100 (FIG. 1). For example, electronic media device 206 may include display 208 for presenting media content and advertising (e.g., full-motion video clips and images) as well as presenting a visual interface for applications running on electronic media device 206. Input mechanism 210, which takes the form of a click wheel in the example of FIG. 2, may be used to interact with the applications, prompts, and overlays displayed in display 208.

Electronic media device 206 may be housed in encasing 203 with front layer 204 and back layer 202. In some embodiments, encasing 203 may be formed from any type of plastic or polymer, which may include, for example, any thermoplastic, thermoset, acrylic fiber, synthetic resin, styrene, or other suitable material. For example, the material forming encasing 203 may include a thermoplastic or thermosetting polymer with a high melting point. In some embodiments, red phosphorous may be incorporated into the polymer to improve its flame-retardant properties and increase its melting point. The red phosphorous may be surface treated on one or more of front layer 204 and back layer 202 to increase the melting point of encasing 203.

Encasing 203 may take the form of a sleeve or other receptacle for housing electronic media device 206 between front layer 204 and back layer 202. Encasing 203 may be open at one or both ends to allow electronic media device 206 to be removed. In some embodiments, encasing 203 may be configured to open by moving front layer 204 of encasing 203 about a hinge (not shown). After encasing 203 is opened, electronic media device 206 may then be physically removed from encasing 203. Various snap-fit arrangements may also be employed whereby electronic media device 206 may be removed from encasing 203 by applying pressure to one or more pressure points on encasing 203. In still other embodiments, front layer 204 is bonded to back layer 202, and electronic media device 206 is mounted on top of front layer 204. Front layer 204 may be adjoining back layer 202, or a small gap layer (e.g., a layer of air or any non-conductive material) may be positioned between front layer 204 and back layer 202.

As shown in the example of FIG. 2A, at least front layer 204 of encasing 203 may be transparent or partially transparent. In at least some embodiments, both front layer 204 and back layer 202 are fully transparent. In other embodiments, only the portion of front layer 204 aligned with display 208 of electronic media device 206 may be transparent. The portion of front layer 204 that is aligned with display 208 of electronic media device 206 may also be cut away in some embodiments.

Encasing 203 may be attached to backing 216. Backing 216 may include paper, paperboard, cardboard, plastic, or any other suitable type of polymer or material. Although in the example of FIG. 2 backing 216 takes the form of a flat sheet, backing 216 may also take the form of a box or container that surrounds encasing 203. If backing 216 surrounds encasing 203, display 208 may still be visible from outside the box or container. For example, the box or container may be at least partially transparent, or the portion of the box or container obstructing display 208 from view may be cut away.

Backing 216 may also include opening 218. Opening 218 may be designed to receive a peg or hook. In a typical retail display setting, multiple instances of active package 200 may be placed on a single peg or hook, one package in front of another package.

Connector 212 may be attached to a suitable interface on electronic media device 206 in some embodiments. For example, connector 212 may be a 30-pin dock connector that mates with a 30-pin dock connector interface 209 on electronic media device 206. Connector 212 may also be configured to mate with less that all of the pins on an interface of electronic media device 206. For example, connector 212 may couple only to the pins for power, data, or both power and data. For example, in some embodiments, an interface on electronic media device 206 includes four pins to communicate over a USB interface. One pin may be included for USB power (e.g., +5 VDC), one pin may be included for USB ground, one pin may be included for USB data (negative differential, for example, −3.3 VDC), and one pin may be included for USB data (positive differential, for example, +3.3 VDC). Any suitable number and types of pins carrying any suitable types of signals may be used in other embodiments.

While electronic media device 206 is housed within active package 200, charging rules may be defined on the device. The number of battery charge cycles may be minimized by bypassing a battery charge if the battery is already charged above a certain threshold level. For example, if the device battery is charged at a ¾ level (or greater), then a charging rule may prohibit further charging of the battery. Rather, any power delivered to electronic media device 206 through active package 200 may power the device without charging the battery. Various other charging rules may also be defined. For example, the number of battery charge cycles may be monitored by electronic media device 206. When the number of battery charge cycles exceeds a predefined threshold number of battery charge cycles, further charging and discharging of the battery may be avoided. Because the life of a battery may depend on the number of battery charge cycles, reducing the number charge cycles while in active package 200 may help increase battery life. The charging rules may also require that the device battery always remain charged to at least some minimum level (e.g., ¾ full charge). In this way, whenever the consumer decides to purchase the device in active package 200, the device battery has an adequate (or full) charge.

Connector 212 may be integral with encasing 203 in some embodiments. For example, connector 212 may be molded within or as part of encasing 203 and attached to one or more of front layer 204 and back layer 202. In other embodiments, connector 212 may not be integral with encasing 203. This may allow for connector 212 to be removed from encasing 203, for example, prior to a customer leaving a retail location with the device. Connector 212 may also extend beyond the perimeter of encasing 203 in some embodiments. Encasing 203 may have a suitable opening that accepts connector 212 so that connector 212 may be inserted and removed from electronic media device 206 while the device is still secured in encasing 203.

Figure 2B:
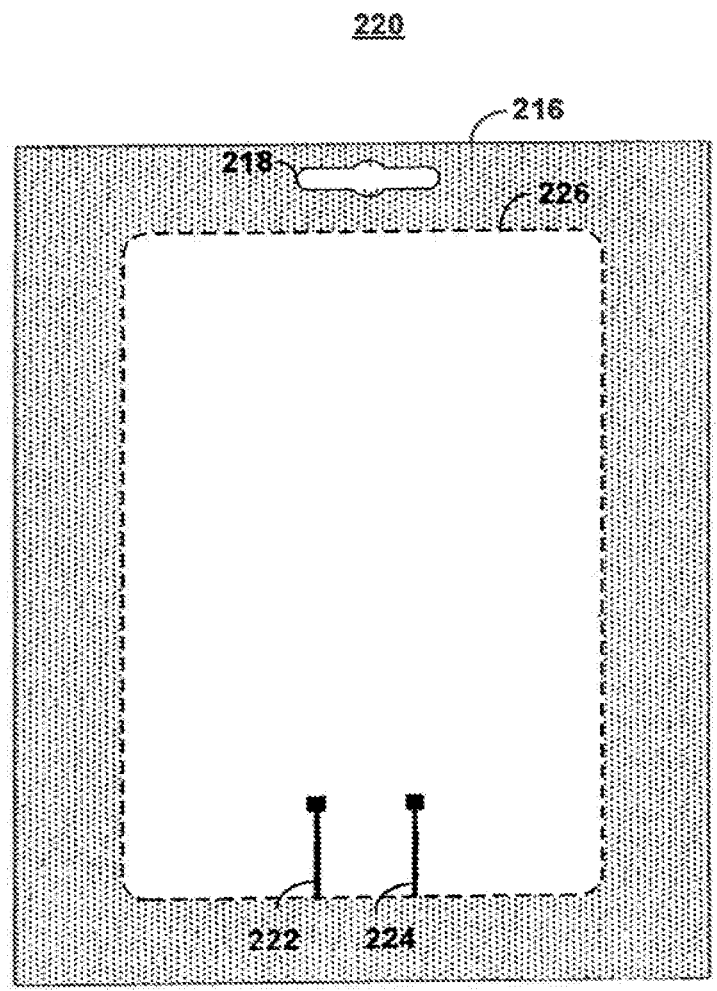
FIG. 2B shows a back view of the illustrative active package of FIG. 2A in accordance with one embodiment of the invention.

FIG. 2B shows back view 220 of active package 200 (FIG. 2A). In some embodiments, backing 216 includes portion 226, which may correspond to encasing 203 (FIG. 2A). Portion 226 may be perforated or partially die-cut through backing 216. This may allow encasing 203 (FIG. 2A) to be pushed through backing 216. For example, after a consumer purchase, encasing 203 (FIG. 2A) may be physically separated from backing 216. Backing 216 and portion 226 (which may not be bonded to back layer 202 (FIG. 2A) of encasing 203 (FIG. 2A)) may both remain in the retail location.

Back portion 226 of backing 216 may be printed (or in-molded) with one or more wire traces, such as wire traces 222 and 224. Wire traces 222 and 224 may be configured to supply power to electronic media device 206 (FIG. 2A). For example, one of wire traces 222 and 224 may supply power, and another of wire traces 222 and 224 may supply ground. Although only wire traces 222 and 224 are shown in the example of FIG. 2B, more than two traces may be printed on (or in-molded into) backing 216 in other embodiments.

Figure 3A:
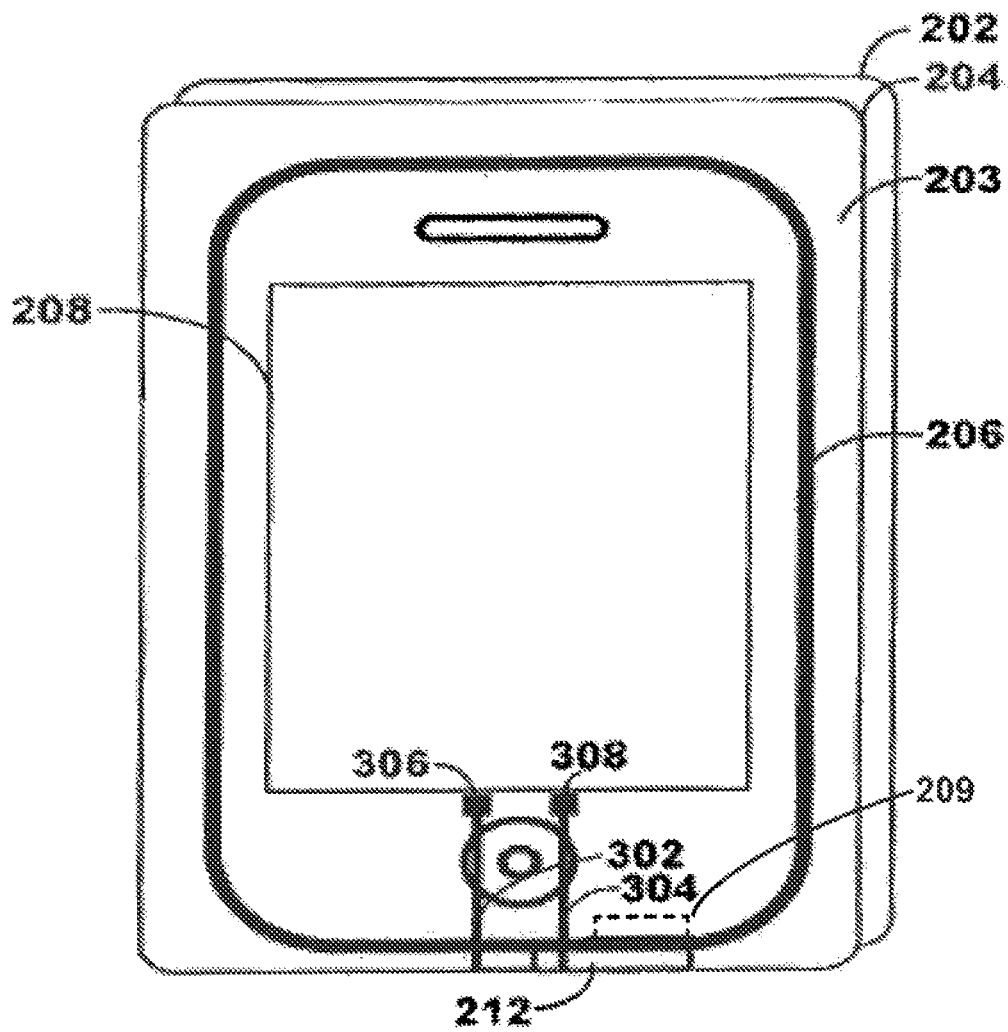
FIGS. 3A-3D are views of another illustrative active package in accordance with one embodiment of the invention.

FIG. 3A shows illustrative active package 300. Active package 300 may be similar to active package 200 (FIG. 2A) and may house electronic media device 206. Encasing 203 may also include one or more wire traces, such as traces 302 and 304, printed onto or within encasing 203. In some embodiments, traces 302 and 304 may be printed during the encasing manufacturing process. For example, traces 302 and 304 may be printed (via any suitable mechanical process) on either side of front layer 204 of encasing 203. The location of traces 302 and 304 may depend on the position of electronic media device 206 relative to encasing 203.

One end of traces 302 and 304 may be routed to connector 212, and the other end of traces 302 and 304 may be coupled to contacts 306 and 308. Contacts 306 and 308 may also be printed directly on front layer 204 of encasing 203. Contacts 306 and 308 and traces 302 and 304 may be used to supply power, data, or both power and data, to the electronic media device 206. Although only traces 302 and 304 are shown in the example of FIG. 3A, any number of traces and contacts may be included in active package 300. For example, connector 212 may be a 30-pin dock connector and may include four pins to communicate over a USB interface. Using this example, one trace may supply USB power (e.g., +5 VDC), one trace may supply USB ground, one trace may supply USB data (negative differential, for example, −3.3 VDC), and one trace may supply USB data (positive differential, for example, +3.3 VDC). Any other suitable signals may also be transmitted on traces 302 and 304.

Figure 3B:
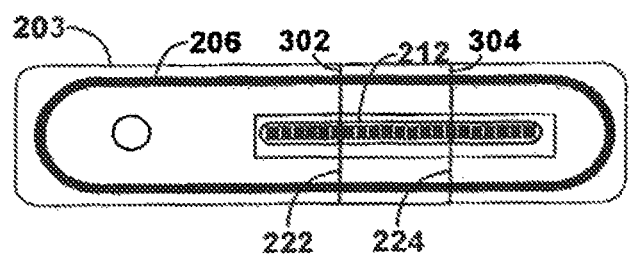

FIG. 3B shows bottom view 310 of encasing 203. Connector 212 may securely snap onto a connector interface on the bottom of electronic media device 206. Connector 212 may extend to the bottom of encasing 203. One or more wire traces, such as wire traces 222, 224, 302, and 304, may be printed on or within encasing 203. The traces may be coupled to connector 212. One or more of these traces may also be connected to one or more electrical contacts disposed at any suitable location or locations on the front or back side of encasing 203. For example, wire traces 222 and 224 may be routed to the back side of encasing 203. Wire traces 302 and 304 may be routed to the front side of encasing 203. Since the connector interface of electronic media device 206 may not be centered, one or more of wire traces 222, 224, 302, and 304 may be routed to the center area of encasing 203 before running up the front or down the back side of encasing 203. Wire traces 222, 224, 302, and 304 may be used to route power and ground to the appropriate pins included in any suitable interface on electronic media device 206.

Although, in the example of FIG. 3B, connector 212 is connected to an interface located on the bottom of electronic media device 206, the interface may be situated at any other suitable location on electronic media device 206. Connector 212 may be configured to connect to any type of interface capable of powering or charging electronic media device 206, including, for example, a dock connector interface or an audio minijack interface (e.g., an audio jack socket, as included in the iPod Shuffle products).

In addition, although traces 222 and 302 (as well as traces 224 and 304) may be tied to the same input pin signal, in some embodiments, the traces may be coupled to different pins. For example, if the connector interface includes a suitable power output pin, then the trace leading to the front of encasing 203 may be coupled to that pin instead of the input power pin. Any other suitable pin arrangement for providing power, data, or both power and data to and from electronic media device 206 may be used in other embodiments. For example, in some embodiments, instead of using wire traces, actual insulated wires or a suitable cable (e.g., a USB dock connector cable) may be used.

Figure 3C:
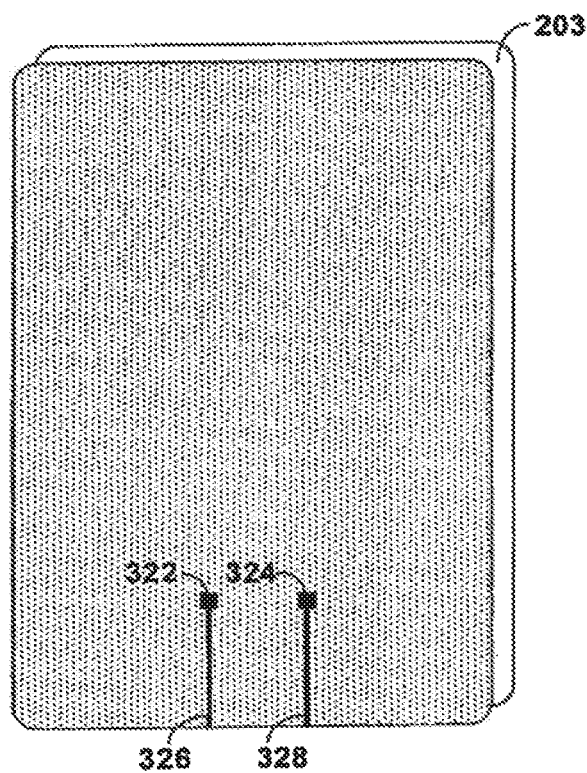

FIG. 3C shows back view 320 of encasing 203. If backing 216 (FIG. 2B) is not used, wire traces 326 and 328 may be printed directly on (or in-molded into) back layer 202 of encasing 203. Contacts 322 and 324 may also be printed onto back layer 202 of encasing 203. Each of traces 326 and 328 may run substantially vertically several centimeters on either side of the center of encasing 203.

Figure 3D:
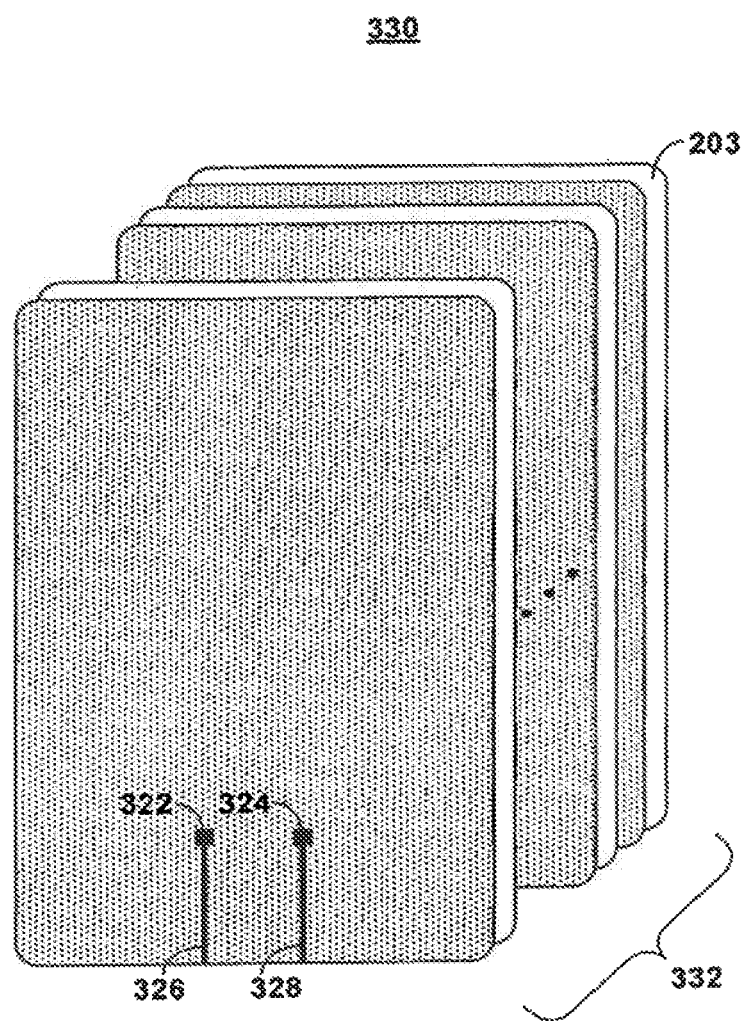

As shown in FIG. 3D, if contacts are included on both the front and back sides of encasing 203, then more than one active package may be conductively stacked in a row, allowing multiple electronic media devices to be powered. For example, active package row 332 may include any number of active packages positioned front to back. This allows contacts on the front of one instance of encasing 203 to be coupled to corresponding contacts on the back of another instance of encasing 203. Conductive stacking in such a manner may allow for an entire stack or row of electronic media devices to be powered from a single connection to an external power source.

To prevent misstacking (e.g., an active package placed front to front or back to back with another active package), grooves or indentations (not shown) may be molded into the front side and/or back side of encasing 203. Different grooves or indentations may be provided on the front and back sides of encasing 203 so as to prevent misstacking. The grooves or indentations may only properly mate with corresponding grooves or indentations when the active packages are stacked correctly. In some embodiments, instead of using a symmetrical encasing, encasing 203 may take some irregular or asymmetric shape that encourages proper stacking. Both asymmetric encasings and grooves or indentations are used in other embodiments.

Figure 4:
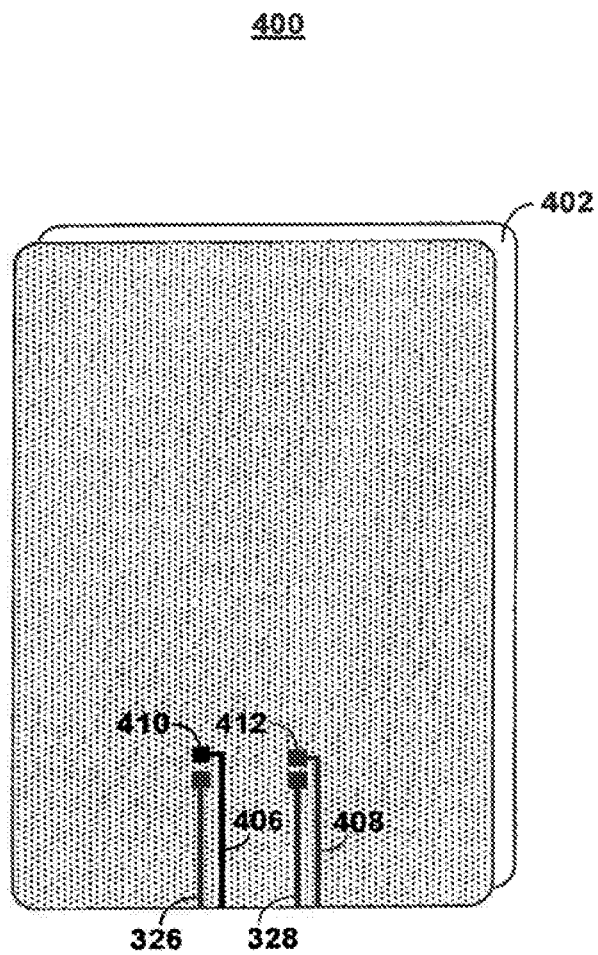
FIG. 4 shows yet another illustrative active package in accordance with one embodiment of the invention.

FIG. 4 shows back view 400 of encasing 402. Encasing 402 may be similar to encasing 203 (FIG. 2A), but may include additional wire traces. For example, in addition to traces 222 and 224, which may provide power and ground, traces 406 and 408 may be in-molded or printed onto the back and/or front side of encasing 402. Traces 406 and 408 may be routed to the appropriate pins or connectors that provide data to the electronic media device housed within encasing 402. Traces 406 and 408 may be used together to provide a differential data signal to the device. For example, one trace may be included for a first USB data signal (negative differential, for example, −3.3 VDC), and another trace may be included for a second USB data signal (positive differential, for example, +3.3 VDC).

The active package including encasing 402 may be conductively stacked in a similar manner as shown in FIG. 3D. The conductive stacking may allow for power, ground, and data to be transmitted to an entire stack or row of active packages.

Figure 5A:
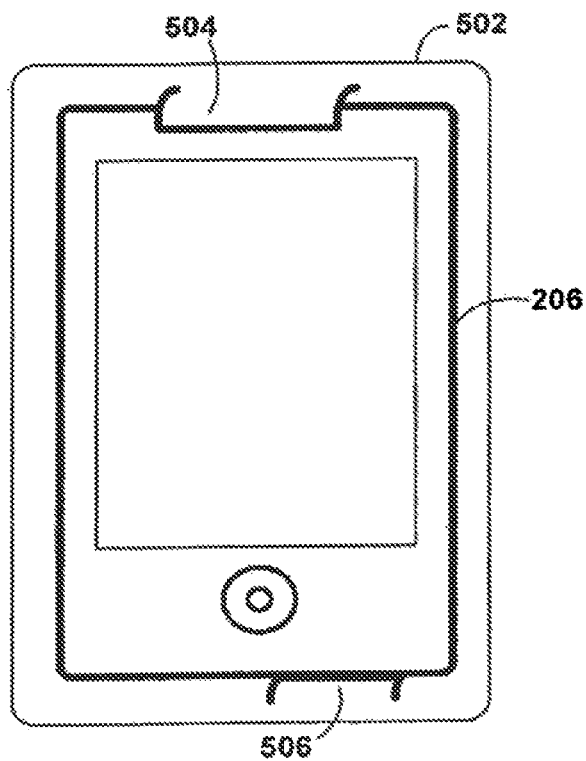
FIGS. 5A-5C show illustrative configurations for mounting the electronic media device of FIG. 1 in accordance with one embodiment of the invention.

FIG. 5A shows illustrative active package 500. Active package 500 includes backing 502, which may be formed from any suitable material, such as plastic, paper, cardboard. For example, in some embodiments, backing 502 takes the form of a rigid or semi-rigid plastic sheet or card. Backing 502 may include one or more hooks or clasps, such as hooks 504 and 506, that hold electronic media device 206 to backing 502. Hooks 504 and 506 may include any clasp or fastener that is configured to secure electronic media device 206 to backing 502. Hook 504 may hold the top portion of electronic media device 206 to backing 502, and hook 506 may hold the bottom portion of electronic media device 206 to backing 502.

Although in the example of FIG. 5A two hooks are included on backing 502, more or less than two hooks may be used in other embodiments. In addition, the hooks may be disposed at any suitable location on backing 502. For example, instead of or addition to having hooks holding the top and bottom portions of electronic media device 206, backing 502 may include a hook that holds the left side, the right side, or both the left and right sides of electronic media device 206 to backing 502.

Figure 5B:
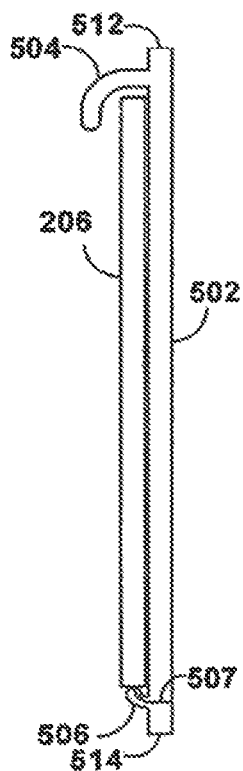

Hook 504 may run along the entire top side of electronic media device 206 or less than the entire top side. Hook 506 may not extend over the face of electronic media device 206. Rather, in some embodiments, hook 506 may be inserted into a suitable interface on electronic media device 206. For example, hook 506 may act as a connector for a dock connector interface. As shown in FIG. 5B, hook 506 of backing 502 may be inserted into an interface on the bottom of electronic media device 206. Backing 502 may include top handle 512 and bottom handle 514 so that backing 502 may be more easily grasped (e.g., by a consumer). One or more wire traces, such as trace 507, may be in-molded or printed onto hook 506 and/or backing 502 so that the traces couple with suitable pins in the interface when hook 506 is inserted into the interface. Using the dock connector interface described above as an exemplary interface, one or more of the following traces may be routed to the appropriate pins in the dock connector interface: USB power (e.g., +5 VDC), USB ground, USB data (negative differential, for example, −3.3 VDC), and USB data (positive differential, for example, +3.3 VDC). Any other suitable signals may also be transmitted on a trace in-molded or printed onto or within hook 506 or backing 506.

Figure 5C:
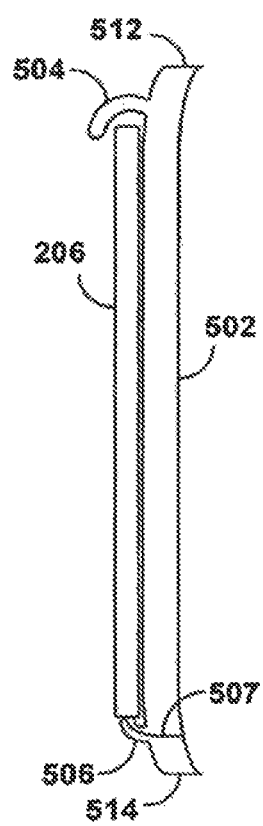

FIG. 5C shows the release of electronic media device 206 from backing 502. A consumer may press or squeeze top handle 512 and bottom handle 514 together in order to bend backing 502 slightly convex. For example, a consumer may gently press top handle 512 down and/or bottom handle 514 up in order to bend each of the top and bottom of backing 502 five to fifteen degrees in the convex direction. One or more of hooks 504 and 506 may then release electronic media device 206. Once released, hook 506 may automatically snap out of the connector interface on electronic media device 206. After hook 506 snaps out of the connector interface, the connection between the interface and trace 507 may be severed. Trace 507 may remain integral with hook 506 and backing 502.

Figure 6A:
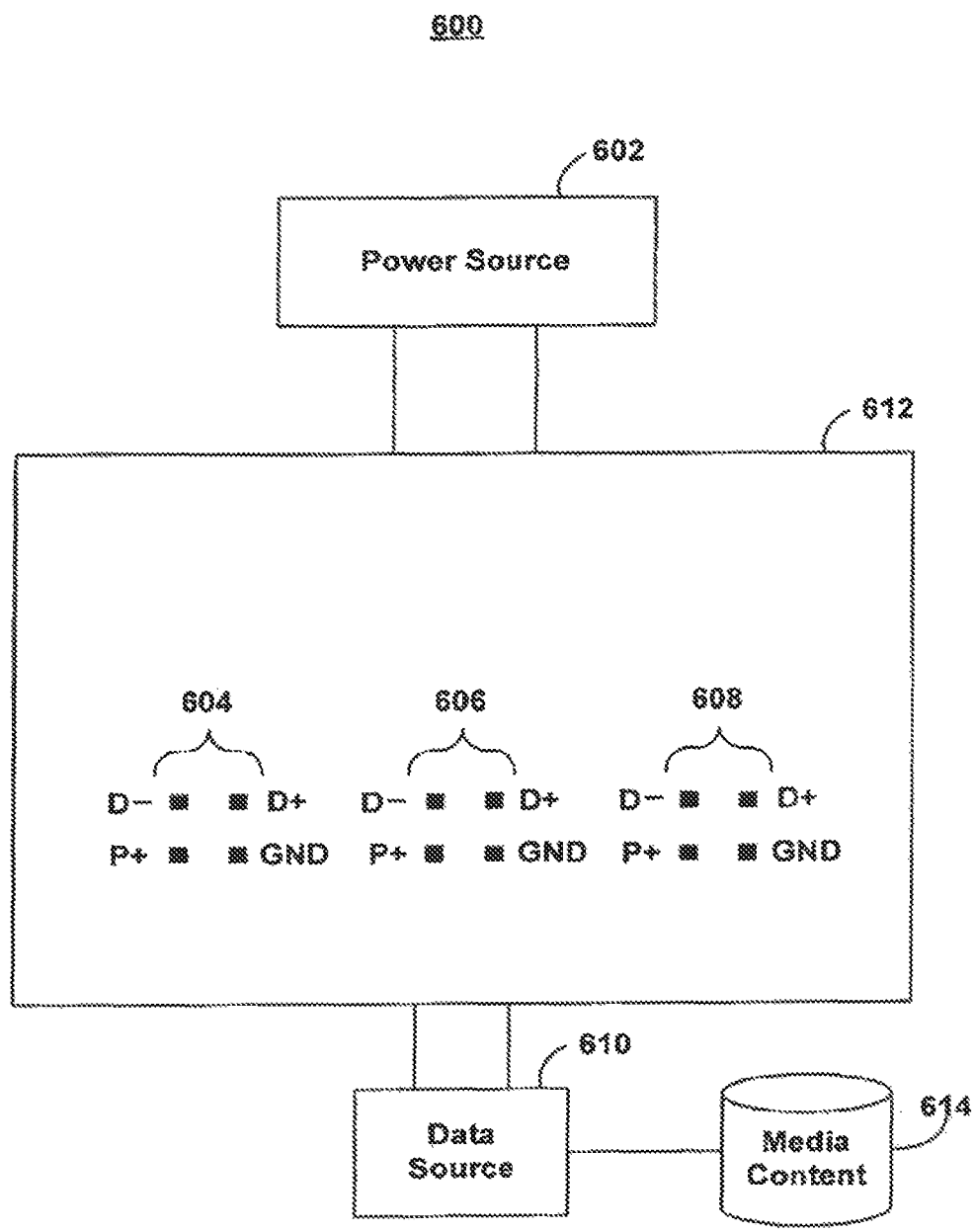
FIGS. 6A and 6B show illustrative active display units for displaying active packages in accordance with one embodiment of the invention.

FIG. 6A shows active display unit 600 for displaying one or more instances of the active packaging of embodiments of the present invention. Display unit 600 may include power source 602, shelving unit 612, and data source 610. Power source 602 may be any suitable external power source or power supply, such as a battery, generator, or power grid. Power source 602 may be an AC or DC power source and may include various circuitry to rectify, invert, or convert the power to any suitable type of power before reaching shelving unit 612.

Shelving unit 612 may include one or more spaces or slots to stack instances of the active packaging of embodiments of the present invention. For example, shelving unit 612 may include pegged spaces to hang or otherwise display the active packages. Each package in a row or stack may transmit power, data, or both power and data, to the package immediately in front of it in the row or stack. In the example of FIG. 6A, shelving unit 612 includes spaces for three rows of active packages, although more or fewer spaces may be available in actual implementations. Each shelving row includes a set of electrical contacts. For example, contact sets 604, 606, and 608 may each include one or more contacts to supply power, ground, and data to the active packages in that row. The power contacts (labeled P+ and GND in the example of FIG. 6A) may be connected to power source 602, and the data contacts (labeled D− and D+ in the example of FIG. 6A) may be connected to data source 610. As described above, in some embodiments, a differential data signal may be used; in other embodiments a signal data contact may be used to transmit any suitable serial data signal.

Data source 610 may be connected to media content 614. For example, media content 614 may include a database of advertisements sorted by genre or provider. Advertisements in media content 614 may be targeted on a local geographic basis. For example, advertisements for local businesses or services may be included in media content 614. Media content 614 may also include a database of movies, digital music, video clips, and images. For example, the movies, video clips, and images may be selected to highlight various features or capabilities supported on the electronic media devices presenting the content. Media content 614 may also store firmware and application updates, bug fixes, and enhancements in some embodiments. Any data or content in media content 614 may be transmitted from data source 610 to the devices on shelving unit 612.

In general, power source 602 may supply the same type of power to all of the active packages displayed in shelving unit 612. For example, +5 VDC may be provided to shelving unit 612 in some embodiments. However, different voltages and types of power may be provided to the same shelving unit depending on the power requirements of the electronic media devices in the active packages displayed on the shelving unit. For example, one row within shelving unit 612 may require +12 VDC while another row requires +5 VDC.

The same or different media content may be provided to each row or stack in shelving unit 612. For example, the same video clip may be sent to all the devices via contact sets 604, 606, and 608. Alternatively, different content may be sent to each row via each contact set. The data and other media content sent to each row may be stored locally on the electronic media devices housed in the active package. The content may also be displayed on each device immediately after receiving the content. For example, data source 610 may stream content for immediate display to each row in some embodiments.

In addition, media content and other data may be addressed to specific devices within a single row or stack in some embodiments. For example, some data may be associated with a serial number or other unique identifier. Although the data may be transmitted through an entire row or stack, only the electronic media device with a matching serial number (or other unique identifier) may store the data locally. All other devices may ignore data addressed to another device. Data may be addressed to all devices in a row or stack by omitting the serial number or unique identifier from the transmission.

Figure 6B:
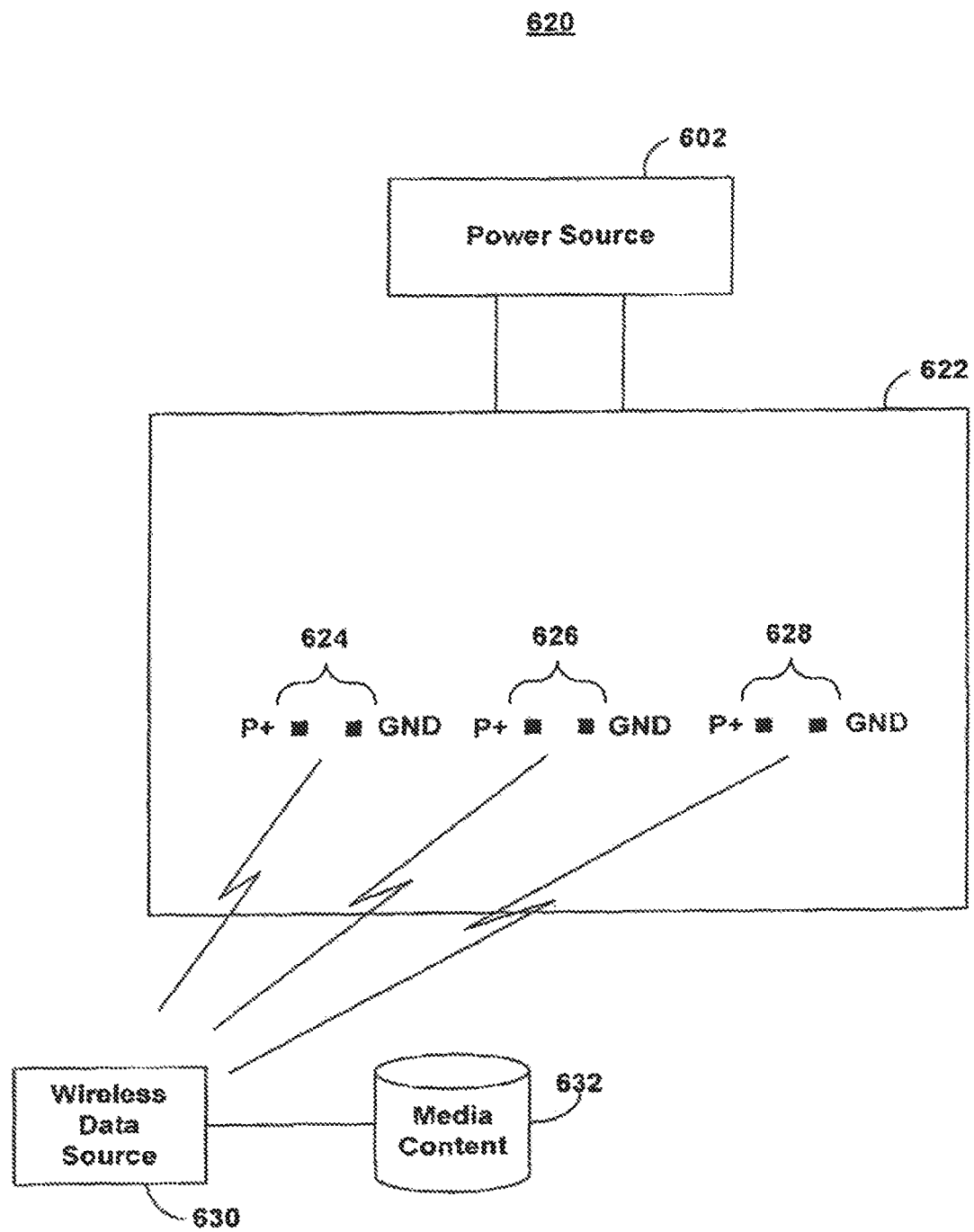

Although both power and data may be supplied via the contacts in contact sets 604, 606, and 608, in some embodiments, power, data, or both power and data are provided wirelessly to the devices displayed on the shelving unit. For example, FIG. 6B shows display unit 620 for wirelessly transmitting media content and other data to the active packages displayed on shelving unit 622. Power source 602 may provide power to the packages via power and ground contacts in contact sets 624, 626, and 628, while wireless data source 630 may provide advertisements, media content, and other data (e.g., firmware and software updates) to the devices. Wireless data source 630 may include any device or circuitry used to support a wireless network, such as, for example, a wireless router, wireless access point, or wireless bridge. Any suitable wireless communications protocol (e.g., 802.11 or WiMax) or any suitable short-range communications protocol (e.g., Bluetooth, IrDA, ultra-wideband (UWB), or ZigBee (e.g., based on the 802.15.4 standard)) may be used to transmit the data to the devices in shelving unit 622. Wireless data source 630 may be connected to a database or data store, such as media content 632. Media content 632 may include the same types of media content included in media content 614 (FIG. 6A).

By transmitting data wirelessly, the data may be sent only to selected devices displayed on shelving unit 622. For example, a device serial number, network address, or Bluetooth device identifier may be used in some embodiments to send data to one or more selected devices. In some embodiments, media content 632 may include content to be pre-loaded or pre-stored onto selected devices. As explained in more detail with regard to FIG. 11, a user may configure the content to be transmitted to each device. For example, firmware and application updates may be transmitted to selected devices needing the updates. After receiving the updates, the devices may automatically apply or execute the updates. In this way, devices on display unit 622 may have the most up-to-date application patches and firmware updates before being purchased by a consumer.

Data may be sent to the electronic media devices displayed on shelving unit 622 continuously or periodically. In order to conserve power, the electronic media devices may operate in a sleep mode whereby the devices only periodically enable their wireless network interfaces every N seconds, where N is any positive number. For example, each device may be configured to enable its wireless network interface once on the hour, once on the half hour, or once every ten minutes. Wireless data source 630 may include an internal clock or timer and may only send data while a device's wireless network interface is enabled.

In addition, a user (e.g., consumer or store employee) may interface with a terminal (e.g., at a kiosk) to configure or schedule automatic updates or content pre-loading of a particular device housed within an active package. For example, a consumer may remove the first active package in a row or stack and read a serial number or other unique identifier from the package (e.g., from a barcode label on the package) or from the device itself. Various updates and content pre-loading options may be supported from the terminal or kiosk. For example, table 1100 (FIG. 11, described in more detail below) may be updated from the terminal or kiosk. The terminal or kiosk may also accept payment information from the user, if a separate charge is associated with the selected updates or content to be pre-loaded. For example, the user may select digital audio files (e.g., MP3 or WMA files) or video files (e.g., feature movies) from media content 632 to pre-load or pre-store onto a device about to be purchased. After payment from the terminal or kiosk (if applicable), the selected audio or video files may then be wirelessly transmitted to the device with the matching serial number without removing the device from the product packaging.

Figure 7A:
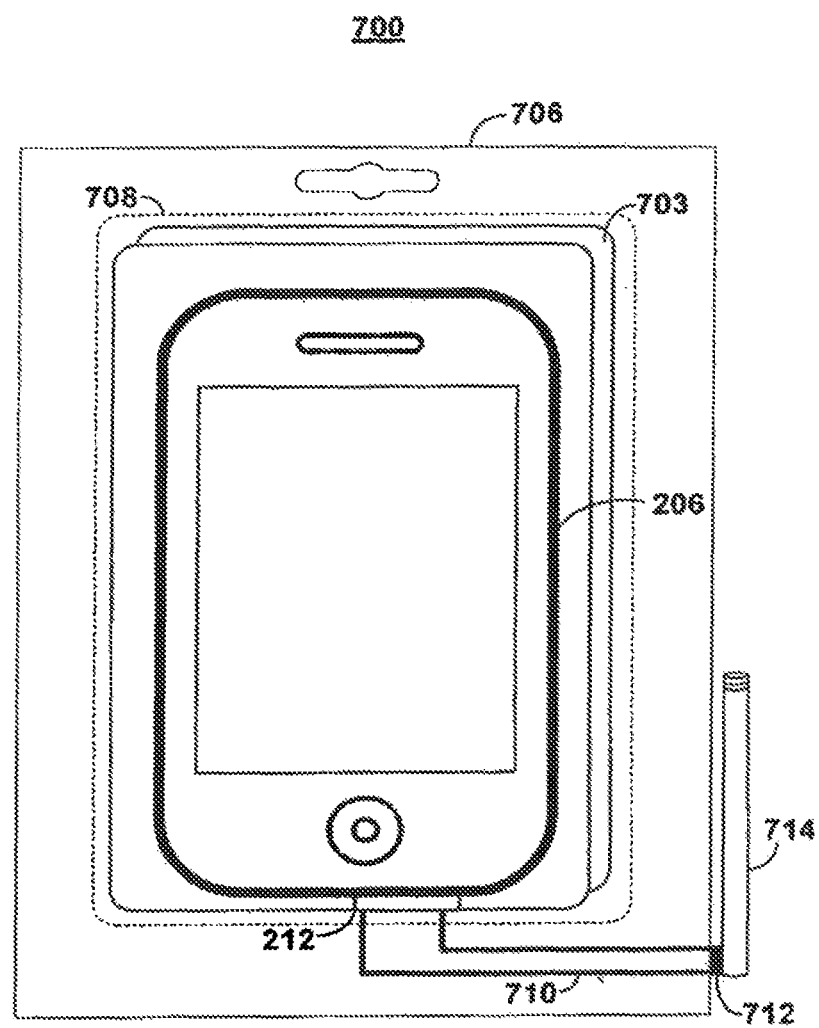
FIGS. 7A and 7B show illustrative active packages with wireless power support in accordance with various embodiments of the invention.

FIG. 7A shows another illustrative active packaging design. Active package 700 may be similar to active package 200 (FIG. 2A) and may include direct or wireless data support. Encasing 703 may house electronic media device 206. Encasing 703 may be mounted or attached to backing 706, which may include all the features of backing 216 (FIG. 2A). Backing 706 may also include perforation 708 that allows encasing 703 to be pushed through and removed from backing 706. Perforation 708 may be partially die-cut through backing 706. Connector 212 may connect to any suitable interface of electronic media device 206 that is capable of powering or charging the device. For example, connector 212 may be inserted into a dock connector interface in some embodiments.

To provide power to electronic media device 206, a wireless power receiver module may be built into or attached to active package 700. For example, antenna 714 may receive RF signals from an RF power transmitter (e.g., RF power transmitter 802 of FIG. 8) and convert the received RF energy into direct current. The current may be used to power or charge electronic media device 206 while it is housed inside active package 700. Antenna 714 may be connected to backing 706 at hinge 712. Hinge 712 may allow antenna 714 to pivot about an axis. Traces 710, which may be in-molded or printed onto backing 706, may route power to connector 212. RF power receiver circuitry (not shown) may be connected to antenna 714 and attached to or integrated within backing 706. For example, an RF power receiver board may run along the side of backing 706 near antenna 714. The RF power receiver circuitry may include a rectifier, which may receive pulses of RF energy power. The pulses of RF energy may be converted to instantaneous open circuit voltages.

In a typical retail setting, antenna 714 (along with any RF power receiver circuitry) may remain at the retail location after the consumer purchases electronic media device 206. Electronic media device 206 and encasing 703 may be pushed through backing 706, physically separating the RF power receiver circuitry (including antenna 714 and hinge 712) from electronic media device 206. Traces 710 may also break at perforation 708 after encasing 703 is pushed through backing 706. In some embodiments, connector 212 may extend beyond the perimeter of encasing 703. In such embodiments, connector 212 may also be removed from electronic media device 206 after purchase. The removed connectors and RF power components may then be reused in other active packages (e.g., to save costs).

Figure 7B:
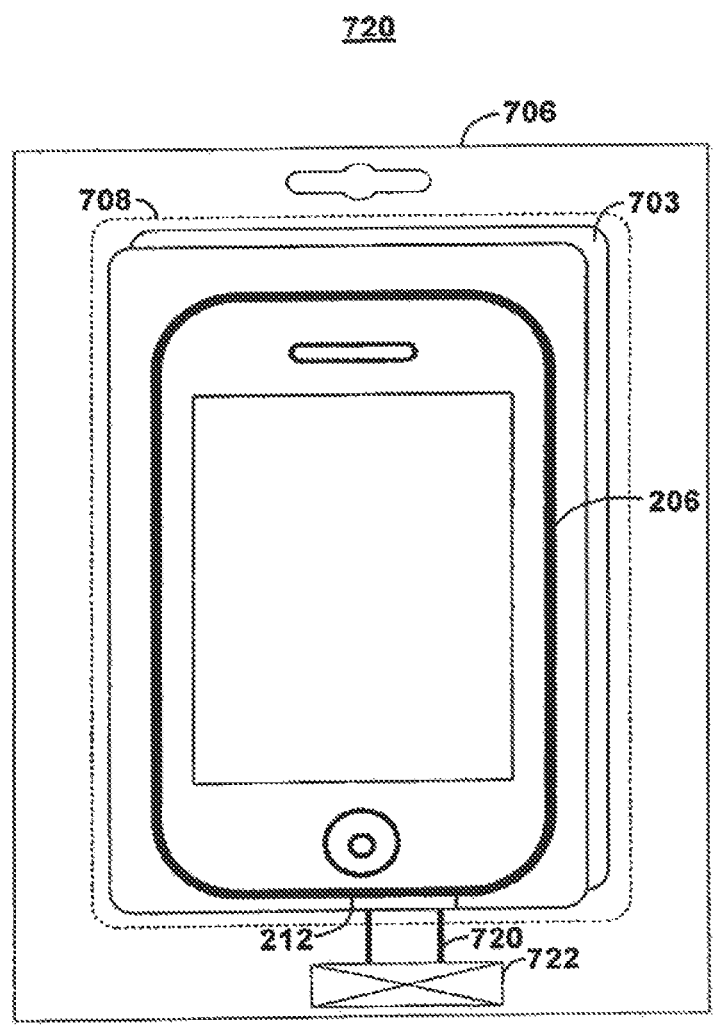

FIG. 7B shows active package 720. Active package 720 is similar to active package 700 (FIG. 7A), but this packaging design may include coiled RF power antenna 722. Coiled RF power antenna 722 may perform the same function as antenna 714 (FIG. 7A) without protruding from backing 706. Antenna 722 may be a flat coiled antenna, and may be made from any conductive material. In some embodiments, antenna 722 may be helical and may respond to electromagnetic fields with circular or elliptical polarization.

Figure 8:
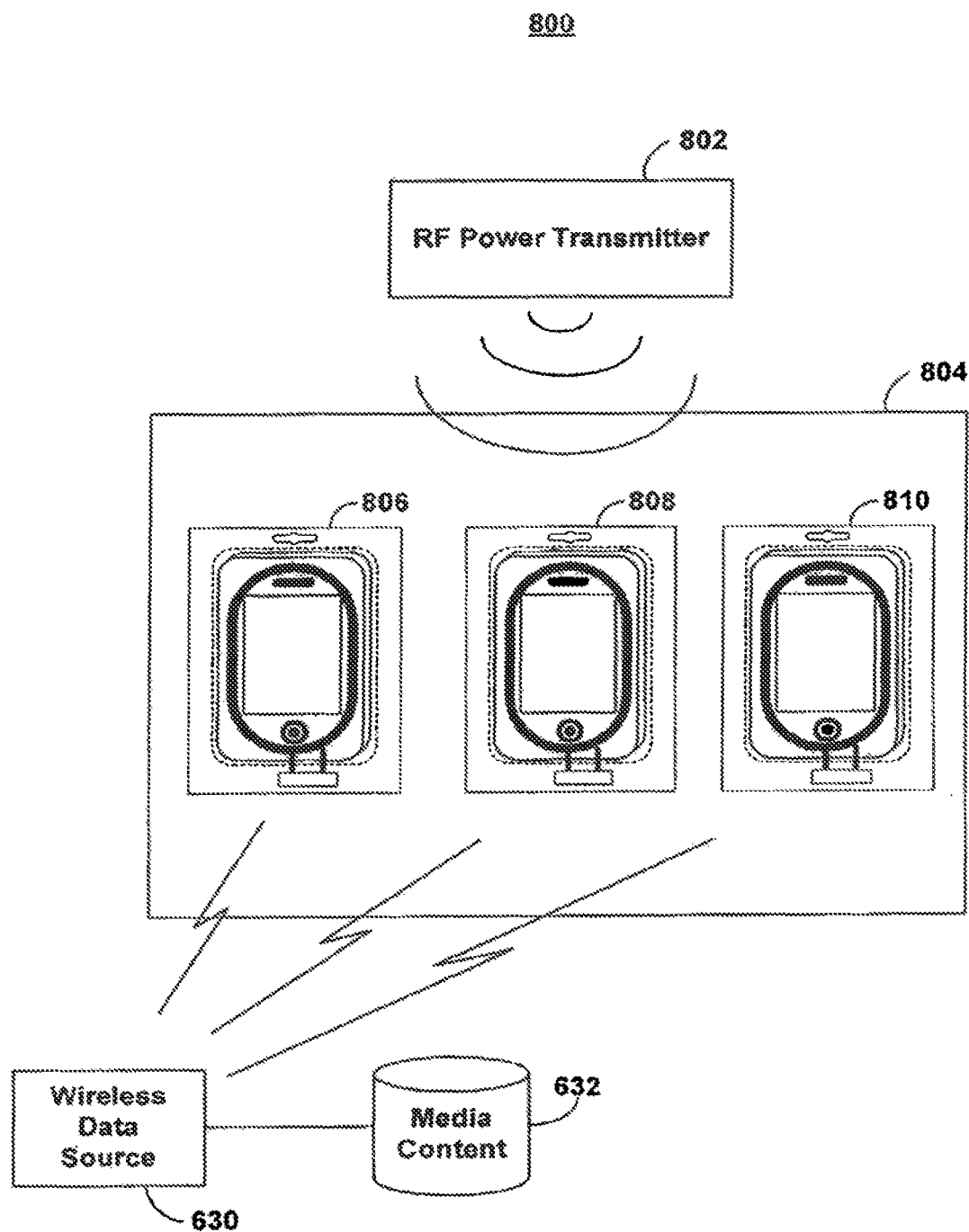
FIG. 8 shows an illustrative active display unit for displaying the active packages of FIG. 7A or FIG. 7B in accordance with one embodiment of the invention.

FIG. 8 shows active display unit 800 for use with active package 700 (FIG. 7A) or active package 720 (FIG. 7B). Display unit 800 may supply both data and power to active packages 806, 808, and 810 wirelessly. RF power transmitter 802 may be electrically coupled to a DC or AC power source (not shown). For example, RF power transmitter 802 may be connected to a standard wall electrical outlet. If connected to an AC power grid, RF power transmitter 802 may include an AC to DC converter that may convert the AC power obtained from the grid to DC voltage or current. RF power transmitter 802 may also include an amplifier in communication with a pulse generator. An antennae may also be connected to the amplifier to radiate RF signals from RF power transmitter 802.

RF power transmitter 802 may output an amplified continuous wave (CW) or pulsed RF signal. If a pulsed RF signal is used, each pulse of the pulsed RF signal may exhibit a different amplitude, which may vary over the duration of the pulse. As such, the amplitude may take several shapes over the duration of the pulse including, for example, a straight line, an increasing or decreasing ramp, a square-wave, a sine-wave, or any other suitable shape. Each pulse of RF energy may be received by antennas attached to or integrated with active packages 806, 808, and 810 on shelving unit 804. Additionally or alternatively, shelving unit 804 itself may include an antenna and RF power receiver circuitry. The power receiver in shelving unit 804 may then power active packages 806, 808, and 810 using a direct electrical connection (e.g., contact sets 624, 626, and 628 of FIG. 6B). In such an embodiment, each of active packages 806, 808, and 810 may not include its own RF power receiver or antenna.

Advertisements, media content, and other data may be transmitted to active packages 806, 808, and 810 wirelessly from wireless data source 630. As described with regard to FIG. 6B, wireless data source 630 may be in communication with media content 632 (e.g., advertisements, media content, and software updates).

Figure 9:
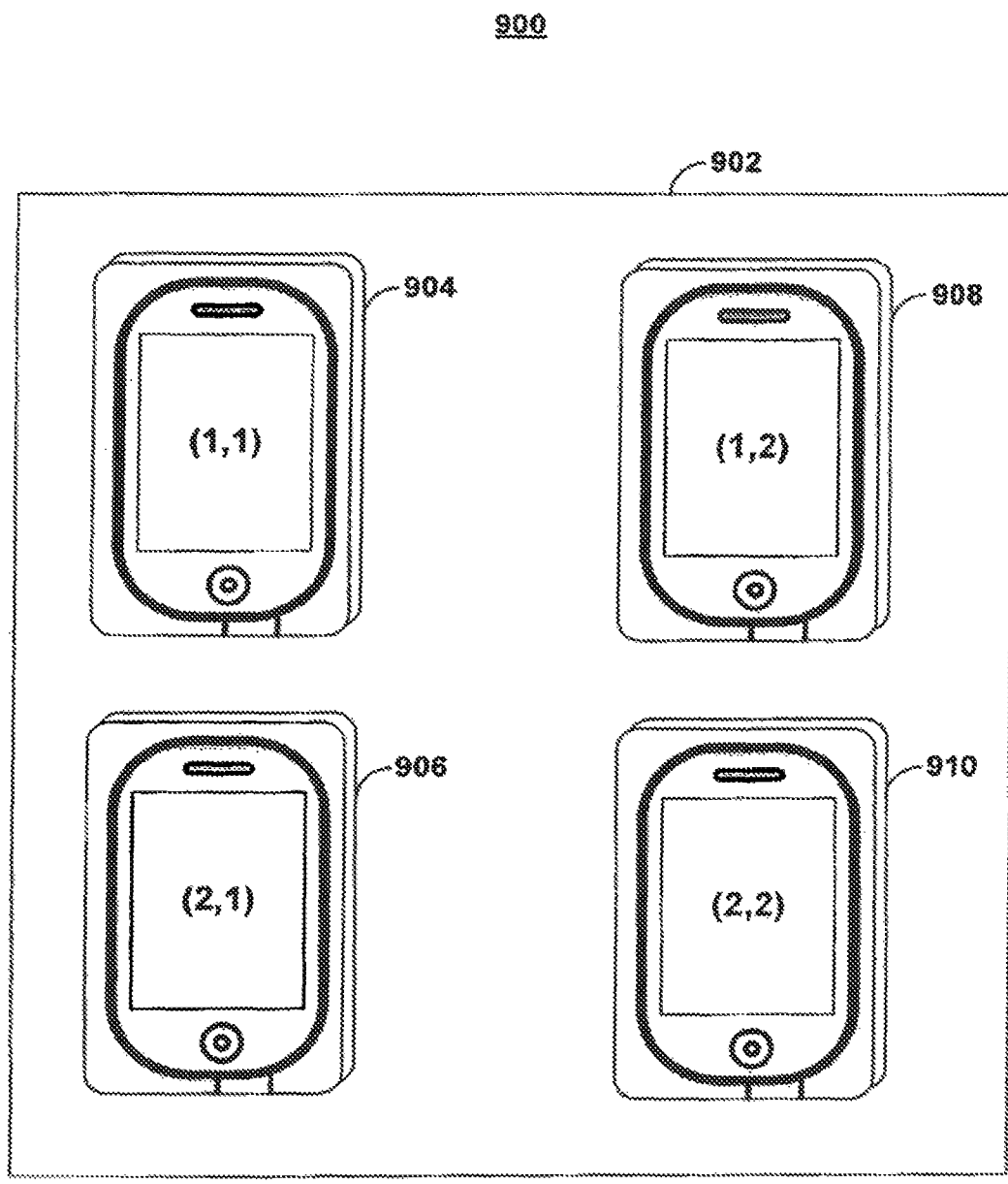
FIG. 9 shows an illustrative coordinated display unit in accordance with one embodiment of the invention.

FIG. 9 shows display unit 900 with coordinated or synchronized display capabilities. Shelving unit 902 may include any number of active packages arranged in a grid (e.g., a square or rectangular grid). In the example of FIG. 9, active packages 904, 906, 908, and 910 are arranged in a square grid, but any other arrangement may be used in other embodiments.

The displays of the electronic media devices in active packages 904, 906, 908, and 910 may be synchronized. For example, the devices in active packages 904, 906, 908, and 910 may synchronize their internal clocks with each other or with a network time server (e.g., using any suitable network time protocol). The devices may synchronize their internal clocks periodically (e.g., every 60 minutes) in some embodiments. The devices may then be configured to simultaneously display some content (e.g., advertising or a video clip) at a specific time or on a predefined schedule. The content may be stored locally on each device or streamed to the devices over a wireless network (or via the direct data signal). A synchronization routine executing on each electronic media device may periodically enable a wireless interface (e.g., a Bluetooth interface) to synchronize each device's internal clock with the internal clocks of all other devices in a display unit. Alternatively, the internal clock of each device within a display unit may be synchronized with a network time server. A set of the electronic media devices within the same display unit may then be configured to display the same frame or portion of media content or advertising at the same time.

A number of other display effects may also be supported. For example, in grid mode, a multi-screen display may be presented on a set of electronic media devices in active packaging. Each device in the grid may be assigned grid coordinates (x,y) based on its location on shelving unit 902. Each device may then display its portion of a larger display. Using the 2.times.2 grid shown in FIG. 9, the device in active package 904 may display the upper left quarter of the display, the device in active package 906 may display the bottom left quarter of the display, the device in active package 908 may display the upper right quarter of the display, and the device in active package 910 may display the bottom right quarter of the display.

A network controller or switch may also randomly select one device from the set of devices on shelving unit 902 to display media content or advertising. The device selected for display may be changed periodically, allowing for a random display effect among a set of devices. Alternatively, one device from the set of active devices may receive a token from the network controller. The token may indicate which device is currently active for display. After receiving the token, the device may automatically display media content or advertising for some predetermined length of time. The token may be passed to another device in the set of devices after the expiration of the predetermined length of time.

The location of each device in the grid may be transmitted to each device using the direct or wireless data signal to each active package. Additionally or alternatively, each device may include one or more POM sensors (e.g., POM sensors 118 of FIG. 1) that may determine the device's location. The POM sensors may include, for example, single-axis or multi-axis accelerometers, angular rate or inertial sensors (e.g., optical gyroscopes, vibrating gyroscopes, gas rate gyroscopes, or ring gyroscopes), magnetometers (e.g., scalar or vector magnetometers), linear velocity sensors, RF triangulation detectors, proximity sensors (e.g., infrared or optical proximity sensors), and ambient light sensors (e.g., photoelectric sensors). After each device is powered, one or more of these POM sensors may automatically determine the position or orientation of each electronic media device.

For example, using an RF triangulation technique, each device may determine its approximate location, for example, within a retail location using an RF triangulation detector. The RF triangulation detector may use various measurements of the device's own network signal to determine its approximate location. Such measurements may include: (1) the angle of the signal's approach to or from one or more wireless access points, (2) the amount of time for the signal to reach one or more wireless access points or the user's media device, (3) the strength of the signal when it reaches one or more wireless access points or the user's media device, or any combination of the aforementioned measurements.

RF fingerprinting may also be used to determine the location of electronic media devices within active packages. RF fingerprinting may compare the device's view of the network infrastructure (i.e., the strength of signals transmitted by infrastructure access points) with a database that contains an RF physical model of the coverage area. This database may be populated by either an extensive site survey or an RF prediction model of the coverage area.

Although only one active package is shown in each row or stack (i.e., grid position) in the example of FIG. 9, more than one active package may be displayed in each grid position in other embodiments. As shown in FIG. 3D, multiple active packages may be positioned front to back in a stack or row. For example, ten or more instances of active packages may be displayed in each row. The device at the front of each row or stack (e.g., the device visible to a consumer) may be designated the active device in that stack or row. The active device may be the only device with its display enabled in each stack or row.

To determine which device in each stack or row is designated as the active device, another POM sensor may be used in some embodiments. For example, an ambient light sensor integrated with or attached to each electronic media device may be used to determine which device is the active device. The ambient light sensor may be positioned near (e.g., above) the display screen of each electronic media device. Devices positioned at the front of each row or stack in a display unit or shelving unit may be exposed to a greater intensity of ambient light than the devices behind another active package or device. The ambient light sensor on each device may convert the intensity of ambient light received by the sensor into a digital signal. When some threshold intensity of ambient light is detected by the ambient light sensor of a device, the device's display may be automatically enabled.

In other embodiments, to determine which device in a row or stack is the active device, some minimum distance to a nearby object may be detected by a proximity sensor (e.g., an optical or infrared proximity sensor) integrated with or attached to each electronic media device. For example, devices in active packages positioned immediately behind another active package may detect a very small distance to nearby objects. Devices positioned in the front of each row or stack, however, may detect some greater distance to nearby objects. The devices within the active packages may be configured to enable their displays only after some threshold distance to nearby objects is detected. Additionally or alternatively, a motion sensor (e.g., a passive infrared (PIR) sensor, active ultrasonic sensor, or active microwave sensor) integrated with or attached to each device may be used to detect motion in front of each device or package. Packages positioned immediately behind another package may detect little no motion while devices at the front of each row or stack may detect some threshold level of motion.

In still other embodiments, the readings from more than one of an ambient light sensor, a proximity sensor, and a motion sensor are used (e.g., in combination) to determine which device is the active device in each stack or row. As a simple example, some minimum intensity of ambient light together with some threshold distance to nearby objects may be used to designate a device in an active package as the active device for each row or stack. This device may then automatically begin displaying advertising or other media content. All devices not designated as active devices in a stack or row may disable their displays to conserve power.

In some embodiments, each device on shelving unit 902 may not display advertising or media content until some physical motion is detected by the device. For example, POM sensors 118 (FIG. 1) may include a dual-axis accelerometer, gyroscope, or some other sensor (or combination of sensors) capable of detecting position, orientation, or movement of the device. If some motion event is detected by POM sensors 118 (FIG. 1) (e.g., a consumer picks up an active package), the device may start displaying advertising or media content. In addition, a custom message or video clip may be displayed. For example, after detecting some threshold amount of motion, the device may display a short video clip (or a custom text message) to the consumer. The video clip may highlight the features and functionality of the device.

In a typical retail setting, the electronic media device in the active package at the front of each row or stack may be designated as the active device for that row or stack. Each active device may then display advertising or some other media content. When a consumer picks up an active package from the front of the stack or row, the device in the active package immediately behind the package that was picked up may then automatically become the active device for that stack or row. That device may then automatically begin displaying advertising or other media content. In this way, each device with a display screen visible to a consumer may be active and displaying content.

Figure 10:
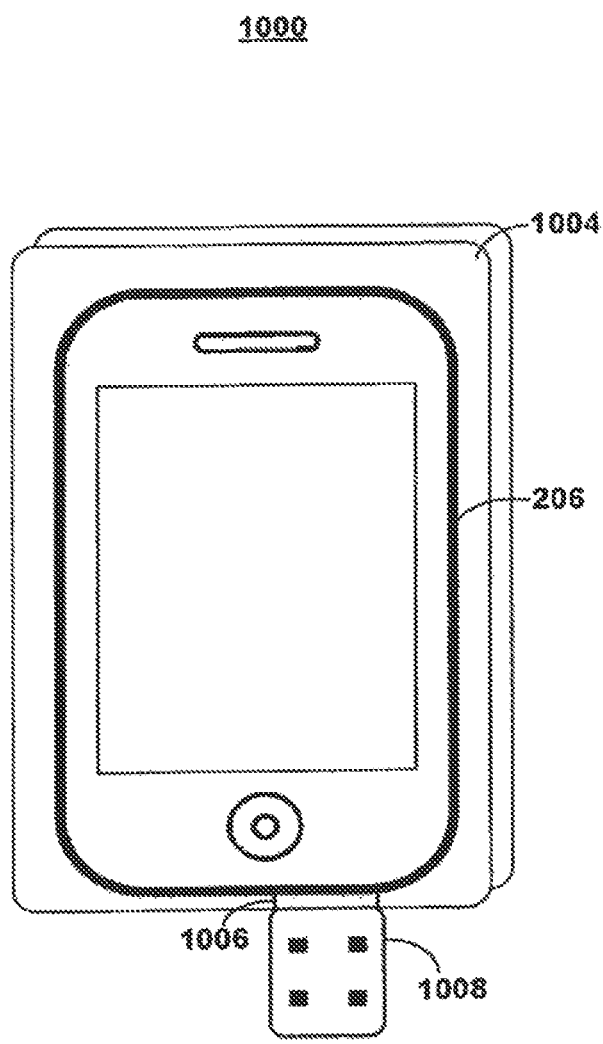
FIG. 10 shows yet another illustrative active package in accordance with one embodiment of the invention.

FIG. 10 shows yet another active packaging design. Active package 1000 may be similar to active package 400 (FIG. 4). However, instead of (or in addition to) printing or in-molding the electrical contacts for power, data, or both power and data directly onto the package or encasing 1004, a cartridge capable of being removed from the active package may be used. For example, cartridge 1008 may include one or more contacts for power, ground, and data printed on one or both sides of the cartridge. Encasing 1004 (with cartridge 1008) may be stacked next to other instances of active package 1000 (similar to active package row 332 of FIG. 3D) and may support conductive stacking.

Cartridge 1008 may interface with connector 1006 (e.g., a dock connector) or may mate directly with some interface capable of powering or charging electronic media device 206. For example, cartridge 1008 may be coupled to a 30-pin dock connector interface on electronic media device 206 in some embodiments. Although cartridge 1008 extends below encasing 1004 in the example of FIG. 10, cartridge 1008 may be positioned at any suitable location and may extend from any suitable perimeter portion of encasing 1004. For example, if active package 1000 is to be displayed on a shelf, then cartridge 1008 may extend off to the left or right side of encasing 1004. If active package 1000 is to be displayed on a peg or hook, then cartridge 1008 may extend below encasing 1004.

Although four contacts are shown on cartridge 1008, more or less than four contact may be included on cartridge 1008 in other embodiments. For example, cartridge 1008 may only include contacts for power and ground. In such embodiments, data may be delivered wirelessly to electronic media device 206 (for example, as shown in FIG. 6B). In another embodiment, RF power receiver circuitry (including antenna 714 of FIG. 7A or antenna 722 of FIG. 7B) may be integrated or attached to cartridge 1008. In such an embodiment, power, data, or both power and data may be supplied wirelessly to electronic media device 206 (for example, as shown in FIG. 8).

Regardless of the components included in cartridge 1008, cartridge 1008 may be removable from active package 1000 in some embodiments. For example, cartridge 1008 may be removed by personnel at a retail location after a consumer purchases electronic media device 206. Cartridge 1008 may then be reused in other active packages.

FIG. 11 shows illustrative update table 1100. Update table 1100 may identify any firmware or application updates that may be applied to one or more electronic media devices while housed in active packaging. Table 1100 may be stored on any suitable network server (e.g., a web server or file transfer protocol (FTP) server) or file system. For example, update table 1100 may be stored at data source 610 (FIG. 6A), wireless data source 630 (FIG. 6B), or as part of media content 614 (FIG. 6A) or media content 632 (FIG. 6B). As described above with regard to FIG. 6B, data may be wirelessly transmitted to electronic media devices via a wireless network while the device are still housed in active packaging. Data may also be sent to electronic media devices via a direct data connection. The data sent to the devices may take many forms. For example, media content 614 (FIG. 6A) and media content 632 (FIG. 6B) may include various application suite customizations, bug fixes, patches, and other updates for firmware or software stored on the devices. Data source 610 (FIG. 6A) or wireless data source 630 (FIG. 6B) may transmit any of this data to specific devices housed in active packaging. The devices may automatically execute or apply each update after it is received. For example, an application thread, process, or subroutine on each device may continuously or periodically monitor a storage device (e.g., storage device 112 of FIG. 1), drive, or directory on the device for newly received files. After a file a received, the thread, process, or subroutine may automatically invoke a suitable application handler and execute the instructions included in the file on control circuitry 106 (FIG. 1).

Table 1100 may include at least serial number column 1102, firmware updates column 1104, application updates column 1106, and content column 1108. Serial number column 1102 may include unique serial numbers (or any other unique identifiers) assigned to (or associated with) electronic media devices in active packaging. For example, serial number column 1102 may include device serial numbers, network addresses, MAC addresses, or any combination of the foregoing identifiers. Firmware updates column 1104 may include a pointer to (or identification of) any updates that may be applied to the firmware of the device identified by the serial number in serial number column 1102. Application updates column 1106 may include a pointer to (or identification of) any updates, patches, bug fixes, or customizations that may be applied to the software or applications stored or installed on the device identified by the serial number in serial number column 1102.

Finally, content column 1108 may include a list of media content (e.g., digital audio and video files) that may be pre-loaded or pre-stored on the device identified by the serial number in serial number column 1102. Each content file in content column 1108 may be identified individually by name (e.g., file name, artist, album, or title). Additionally or alternatively, content packages may be defined in content column 1108. Content packages may include more than one content selection that are related in some way (e.g., related by the same artist or genre). In the example of FIG. 11, three content packages are defined. The "Hip Hop Package" may include a predefined collection of hip hop genre digital music and music video selections. The "Dance Package" may include a predefined collection of dance genre digital music and music video selections. Content packages may also include a collection of content by one or more artists. For example, the "Best of Garth Brooks" package may include digital music and music video selections featuring Garth Brooks.

The content identified by content column 1108 may be selected by a user at a retail location using a separate terminal (e.g., at a kiosk). The terminal may first prompt the user to input a valid serial number (or other unique identifier) associated with the electronic media device that the user desires to update or customize. For example, the user may read the device's serial number from a label on the active package or from the device itself. After a valid serial number has been inputted, a listing of all the updates and media content available for pre-storing or pre-loading may be displayed to the user at the terminal. Packages of media content may also be displayed. The user may then select which updates to apply to the device and what media content to pre-store or pre-load onto the device. In some embodiments, certain patches and updates (called "critical updates") may be automatically selected.

The user may then be prompted to pay for the updates or media content before the updates and media content are sent to the selected electronic media device. The terminal may also connect to a suitable banking institution to authorize and process the payment, if required. A receipt for the payment may be automatically sent to an email address associated with the user. In some embodiments, critical updates may be sent to devices requiring the critical updates automatically without the user selecting them. In this way, all electronic media devices may have the most up-to-date version of firmware and software available before the device leaves the retail location.

Figure 12:
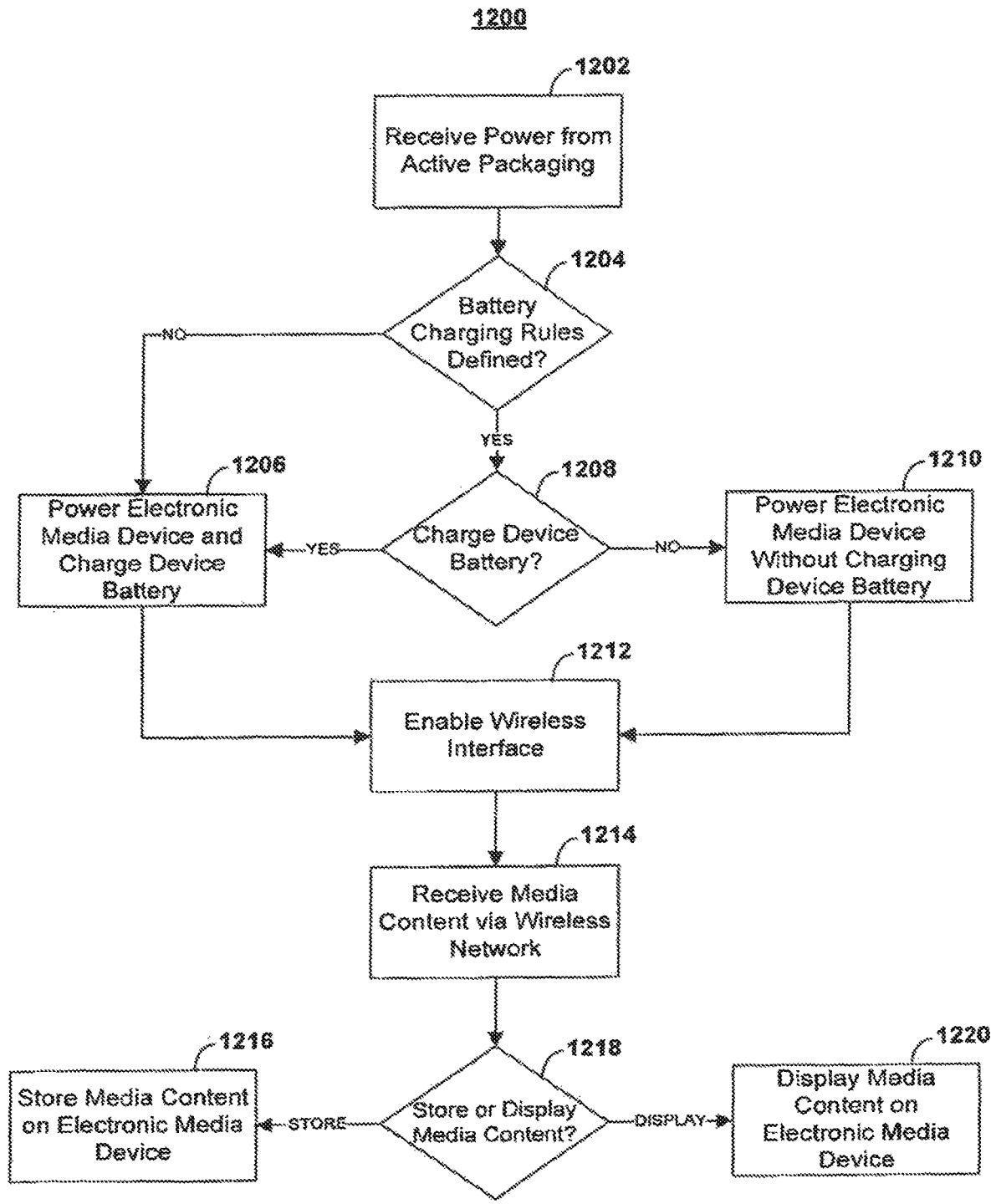
FIGS. 12-16 show various processes for supporting and designing active packaging in accordance with various embodiments of the invention.

FIG. 12 shows illustrative process 1200 for storing or displaying media content on electronic media device 100 (FIG. 1) in active packaging. At step 1202, power may be received by the device from the active packaging. For example, power source 602 (FIG. 6B) may be connected to contacts on a shelving unit, such as shelving unit 622 (FIG. 6B). Contacts on the active packaging, such as contacts 306 and 308 (FIG. 3A) may be coupled to wire traces (such as traces 302 and 304 of FIG. 3A). These traces may be in-molded or printed onto any suitable portion of the active packaging. The traces may route power (and optionally ground) to an interface or connector on electronic media device 100 (FIG. 1). For example, the traces may be coupled to a dock connector, which is mated to a 30-pin dock connector interface on the device. Power may additionally or alternatively be received at step 1202 via one or more wireless power techniques. For example, antenna 714 (FIG. 7A) or 722 (FIG. 7B) may be connected to RF power receiver circuitry and used to power the device.

At step 1204, electronic media device 100 (FIG. 1) may determine if battery charging rules are defined. For example, battery charging rules may help reduce or limit the number of battery charge cycles while still maintaining a minimum battery charge level. If battery charging rules are defined at step 1204, then, at step 1208, electronic media device 100 (FIG. 1) may determine if the device battery should be charged based on the charging rules. For example, control circuitry 106 (FIG. 1) may access a set of charging rules stored on storage device 112 (FIG. 1). Control circuitry 106 (FIG. 1) may then compare any suitable device variables (e.g., the number and type of batteries in the device, the current charge level of each battery, and the number of charge cycles) to the charging rules.

As an example, if the device battery is charged at a ¾ level (or greater), then a charging rule may prohibit further charging of the battery. Rather, any power delivered to electronic media device 100 (FIG. 1) through the active packaging may power the device without charging the battery. Various other charging rules may also be defined. If the device determines that the device battery should be charged at step 1208, or if no charging rules are defined at step 1204, then electronic media device 100 (FIG. 1) may be powered and its device battery may be charged at step 1206. If the device determines that the device battery should not be charged at step 1208, then the device may be powered without charging the device battery at step 1210.

After the device is powered, electronic media device 100 (FIG. 1) may enable its wireless interface at step 1212. It may then receive media content over a wireless network at step 1214. For example, the device may receive media content over a Wi-Fi, WiMax, or Bluetooth network in some embodiments. At step 1218, the device may determine if the received media content should be stored or displayed on the device. If the received content should be displayed, then at step 1220 the device may display the received content. For example, control circuitry 106 (FIG. 1) may cause the content to be displayed on output component 104 (FIG. 1). If the received content should be stored, then at step 1216 the device may store the received content (e.g., in memory 110 or on storage device 112, both of FIG. 1).

In practice, one or more steps shown in illustrative process 1200 may be combined with other steps, performed in any suitable order, performed in parallel (e.g., simultaneously or substantially simultaneously), or removed. For example, at step 1218, the electronic media device may both 1) store the received media content at step 1216 and 2) display the content at step 1220. For example, a database of advertising and media content may be stored locally on each electronic media device. The device may then select some content from the database of content for display.

Figure 13:
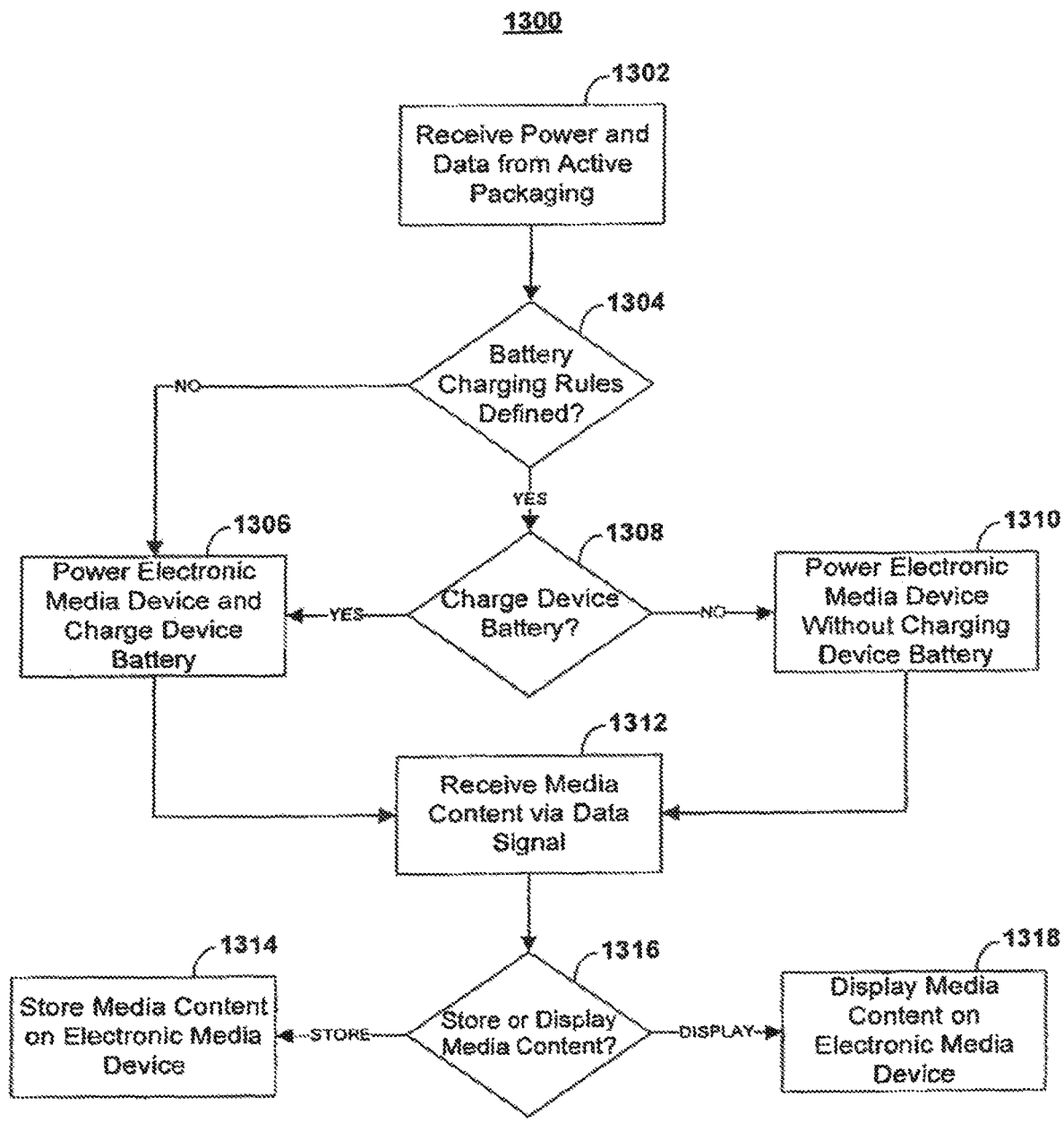

FIG. 13 shows illustrative process 1300 for storing or displaying media content on electronic media device 100 (FIG. 1) in active packaging. At step 1302, power and data may be received by the device from the active packaging. For example, power source 602 (FIG. 6B) may be connected to contacts on a shelving unit, such as shelving unit 622 (FIG. 6B). Contacts on the active packaging, such as contacts 306 and 308 (FIG. 3A) may be coupled to wire traces (such as traces 302 and 304 of FIG. 3A). These traces may be in-molded or printed onto any suitable portion of the active packaging. The traces may route power (and optionally ground) to an interface or connector on electronic media device 100 (FIG. 1). For example, the traces may be coupled to a dock connector, which is mated to a 30-pin dock connector interface on the device. Power may additionally or alternatively be received at step 1302 via one or more wireless power techniques. For example, antenna 714 (FIG. 7A) or 722 (FIG. 7B) may be connected to RF power receiver circuitry and used to power the device.

Data may be received at step 1302 via a direct data signal. For example, one or more of traces 406 and 408 (FIG. 4) may be in-molded or printed onto the active packaging. These traces may route a differential data signal to a suitable interface on electronic media device 100 (FIG. 1).

At step 1304, electronic media device 100 (FIG. 1) may determine if battery charging rules are defined. For example, battery charging rules may help reduce or limit the number of battery charge cycles while still maintaining a minimum battery charge level. If battery charging rules are defined at step 1304, then, at step 1308, electronic media device 100 (FIG. 1) may determine if the device battery should be charged based on the charging rules. For example, control circuitry 106 (FIG. 1) may access a set of charging rules stored on storage device 112 (FIG. 1). Control circuitry 106 (FIG. 1) may then compare any suitable device variables (e.g., the number and type of batteries in the device, the current charge level of each battery, and the number of charge cycles) to the charging rules. Various other charging rules may also be defined. If the device determines that the device battery should be charged at step 1308, or if no charging rules are defined at step 1304, then electronic media device 100 (FIG. 1) may be powered and its device battery may be charged at step 1306. If the device determines that the device battery should not be charged at step 1308, then the device may be powered without charging the device battery at step 1310.

After the device is powered, electronic media device 100 (FIG. 1) may receive media content via the direct data signal at step 1312. At step 1316, the device may determine if the received media content should be stored or displayed on the device. If the received content should be displayed, then at step 1318 the device may display the received content. For example, control circuitry 106 (FIG. 1) may cause the content to be displayed on output component 104 (FIG. 1). If the received content should be stored, then at step 1314 the device may store the received content (e.g., in memory 110 or on storage device 112, both of FIG. 1).

In practice, one or more steps shown in illustrative process 1300 may be combined with other steps, performed in any suitable order, performed in parallel (e.g., simultaneously or substantially simultaneously), or removed. For example, at step 1316, the electronic media device may both 1) store the received media content at step 1314 and 2) display the content at step 1318. For example, a database of advertising and media content may be stored locally on each electronic media device. The device may then select some content from the database of content for display.

Figure 14:
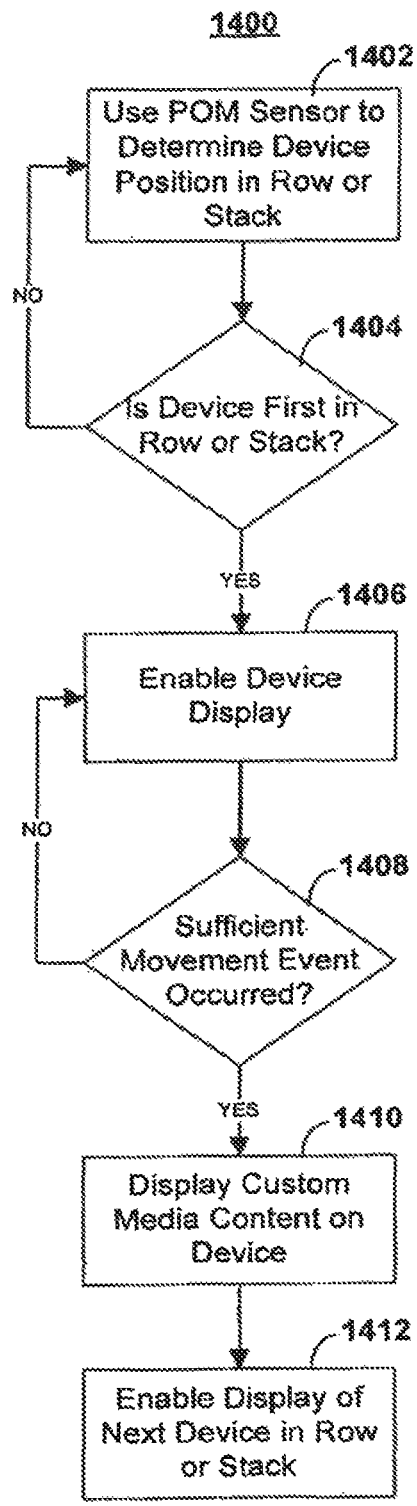

FIG. 14 shows illustrative process 1400 for displaying custom content on an electronic media device in active packaging. At step 1402, one or more POM sensors may be used to determine the position of the device within a row or stack. For example, POM sensors 118 (FIG. 1) may be used to determine the location of the device within a retail location. From the POM sensors, electronic media device 100 (FIG. 1) may determine, at step 1404, if it is in the first position in the row or stack. The first position in the row or stack may be the position visible to consumers (e.g., not blocked by other packages or devices). To determine if it is in the first position, electronic media device 100 (FIG. 1) may access sensor readings from one or more POM sensors (e.g., POM sensors 118 of FIG. 1).

For example, an ambient light sensor integrated with or attached to each electronic media device may be used to determine which device is in the first position of a row or stack. The ambient light sensor may be positioned near (e.g., above) the display screen of each electronic media device (e.g., electronic media device 100 of FIG. 1). Devices positioned at the front of each row or stack in a display unit or shelving unit may be exposed to a greater intensity of ambient light than the devices behind another active package or device. The ambient light sensor on each device may convert the intensity of ambient light received by the sensor into a digital signal. When some threshold intensity of ambient light is detected by the ambient light sensor of a device, this device may determine that it is in the first position of a row or stack.

In other embodiments, to determine which device is in the first position of a row or stack, some minimum distance to a nearby object may be detected by a proximity sensor (e.g., an optical or infrared proximity sensor) integrated with or attached to each electronic media device. For example, devices in active packages positioned immediately behind another active package may detect a very small distance to nearby objects. Devices positioned in the front of each row or stack, however, may detect some greater distance to nearby objects. Additionally or alternatively, a motion sensor (e.g., a passive infrared (PIR) sensor, active ultrasonic sensor, or active microwave sensor) integrated with or attached to each device may be used to detect motion in front of each device or package. Packages positioned immediately behind another package may detect little or no motion while devices in the first position of each row or stack may detect some threshold level of motion.

In still other embodiments, the readings from more than one of an ambient light sensor, a proximity sensor, and a motion sensor are used (e.g., in combination) to determine which device is in the first position of each stack or row. As a simple example, some minimum intensity of ambient light together with some threshold distance to nearby objects may be used to designate a device as in the first position for each row or stack.

If a device determines that it is in the first position of its row or stack, then at step 1406 the device may enable its display. If the device determines it is not in the first position, it may return to step 1402 to determine its position once again. In some embodiments, to conserve power, a device may attempt to determine its position within a stack or row once every X seconds, where X is any positive number. At step 1406, the device with its display enabled may also automatically begin presenting media content or advertising.

The device may continue to display media content or advertising until some movement event occurs. For example, the device may be removed from the display unit at step 1408. To remove the device from the display unit, a consumer may physically pick up and remove the active package from shelving unit 612 (FIG. 6A), 622 (FIG. 6B), or 804 (FIG. 8). At step 1408, electronic media device 100 (FIG. 1) may access POM sensors 118 (FIG. 1). For example, readings from one or more of a motion detector and an accelerometer (e.g., a dual-axis accelerometer) may be accessed to determine if a sufficient movement event has occurred. Alternatively, one or more of POM sensors 118 (FIG. 1) may automatically signal control circuitry 106 (FIG. 1) when a sufficient movement event occurs.

If a sufficient movement event has been signaled, a custom message, media content selection, or both may be displayed on the device at step 1410. For example, the message "Hello" may be displayed at step 1410 with an introductory video clip of advertising relating to the device. At step 1412, the next device in the row or stack may then enable its display and become the new active device in that row or stack. In this way, at least one device in each row or stack (e.g., the device visible to consumers) may have its display enabled.

In practice, one or more steps shown in illustrative process 1400 may be combined with other steps, performed in any suitable order, performed in parallel (e.g., simultaneously or substantially simultaneously), or removed.

Figure 15:
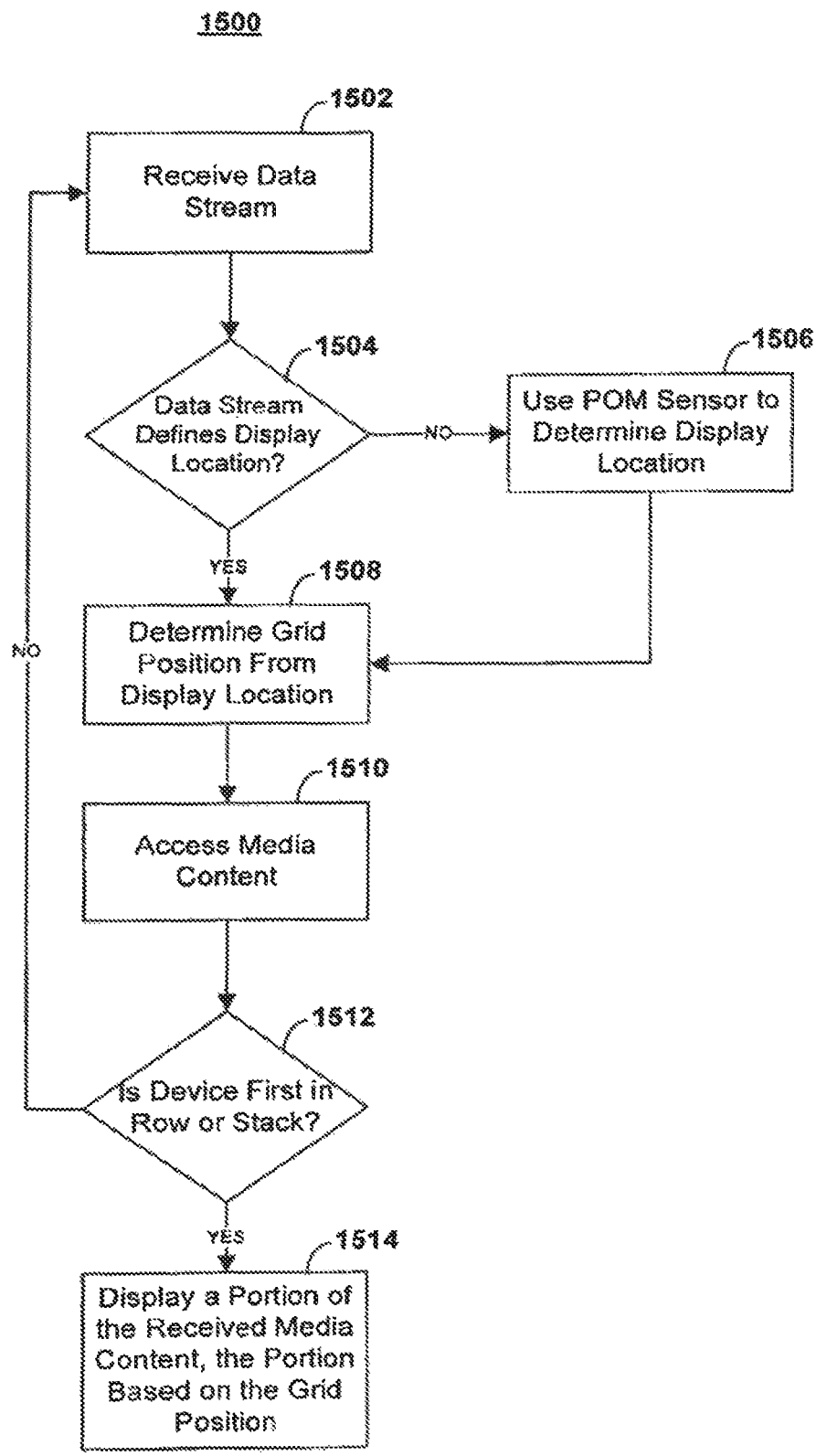

FIG. 15 shows illustrative process 1500 for supporting a multi-screen display on a set of electronic media devices in active packaging. At step 1502, a data stream is received by electronic media device 100 (FIG. 1). The data stream may be received at step 1502 over a wireless network or a direct data signal. For example, one or more of traces 406 and 408 (FIG. 4) may be in-molded or printed onto the active packaging. These traces may route a differential data signal to a suitable interface on electronic media device 100 (FIG. 1).

At step 1504, electronic media device 100 (FIG. 1) may determine if the received data stream defines location information for the device. For example, location information may be transmitted via the direct data signal to an entire stack or row of devices in active packaging. The devices may be part of the same active package row, as shown in active package row 332 (FIG. 3D). If the received data stream does not define location information for the device, then at step 1506 one or more POM sensors may be accessed to determine the device's display location. For example, using an RF triangulation detector, the approximate location of the device may be determined using a suitable RF triangulation technique. RF fingerprinting may also be used to increase accuracy of the RF triangulation. Any other of POM sensors 118 (FIG. 1) may also be used to determine the location of the device.

At step 1508, the device's grid position may be determined from the location information received from the data stream or the POM sensors. For example, as shown in FIG. 9, the x-coordinate and y-coordinate of the device in the display grid may be represented as an ordered pair. Any other suitable data structure may be used in other embodiments.

After the device's position in the display grid has been determined, then at step 1510 media content may be accessed. For example, the media content may be already stored in memory 110 (FIG. 1) or storage device 112 (FIG. 1). Media content may also be received at step 1510 over a wireless network or a direct data signal. At step 1512, the device may determine if it is the active device for its row or stack. For example, if the device determines that it is in the first position in the stack or row (i.e., the position visible to consumers), then the device may be designated the active device for that stack or row. If the device determines that it is not the active device for that stack or row, illustrative process 1500 may return to step 1502.

If, however, the device is the active device, then at step 1514 the device may display a portion of the received media content. The portion displayed may be based, at least in part, on the device's position in the grid. Each device may display its portion of a larger display. For example, using the 2.times.2 grid shown in FIG. 9, the device in active package 904 may display the upper left quarter of the display. Alternatively, each device may only receive its portion of the larger multi-screen display rather than receiving the entire multi-screen display feed. If each device only receives its portion of the multi-screen display, then the device may display its portion without determining its grid position at step 1508.

In practice, one or more steps shown in illustrative process 1500 may be combined with other steps, performed in any suitable order, performed in parallel (e.g., simultaneously or substantially simultaneously), or removed.

Figure 16:
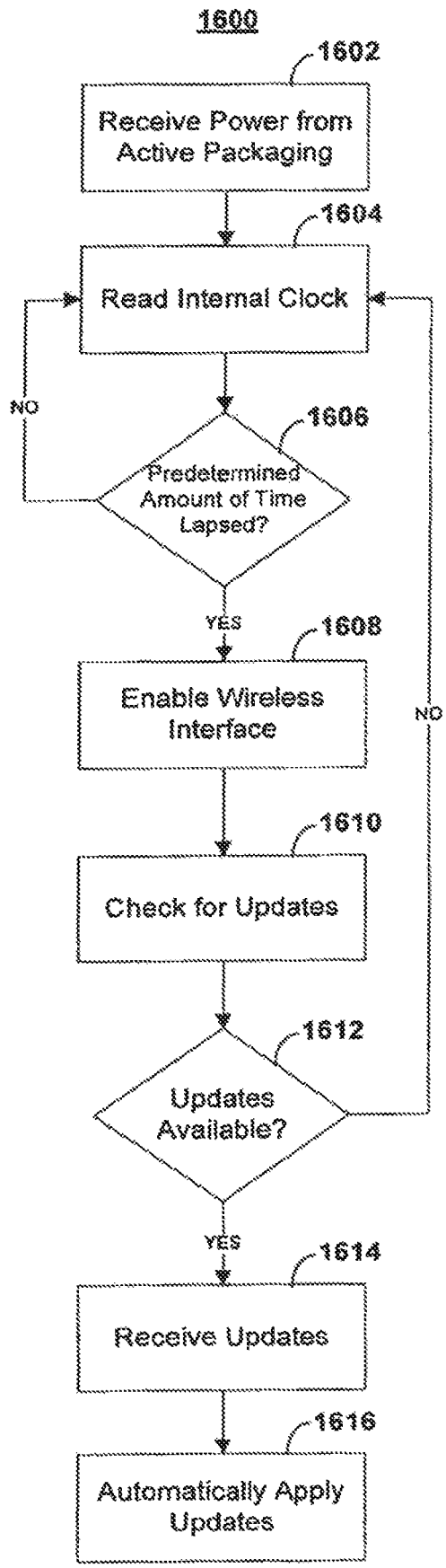

FIG. 16 shows illustrative process 1600 for updating or storing content on an electronic media device while housed in active packaging. At step 1602, electronic media device 100 (FIG. 1) may receive power from the active packaging. For example, power source 602 (FIG. 6B) may be connected to contacts on a shelving unit, such as shelving unit 622 (FIG. 6B). Contacts on the active packaging, such as contacts 306 and 308 (FIG. 3A) may be coupled to wire traces (such as traces 302 and 304 of FIG. 3A). These traces may be in-molded or printed onto any suitable portion of the active packaging. The traces may route power (and optionally ground) to an interface or connector on electronic media device 100 (FIG. 1). For example, the traces may be coupled to a dock connector, which may be mated to a 30-pin dock connector interface on the device. Power may additionally or alternatively be received at step 1602 via one or more wireless power techniques. For example, antenna 714 (FIG. 7A) or 722 (FIG. 7B) may be connected to RF power receiver circuitry and used to power the device.

At step 1604, the device's internal clock may be read. For example, control circuitry 106 (FIG. 1) may access an internal system clock or timer. If, at step 1606, a predetermined amount of time has lapsed since the last update check, then at step 1608 electronic media device 100 (FIG. 1) may enable its wireless interface. If the predetermined amount of time has not lapsed, illustrative process 1600 may return to step 1604 to read the internal clock once again. The electronic media device (e.g., electronic media device 100 of FIG. 1) may check for updates on any suitable schedule (for example, every 30 minutes, every hour, or once each day).

After the device's wireless interface is enabled, it may check for updates at step 1610. For example, the device may access update table 1100 (FIG. 11) and look up its serial number, network address, or other unique identifier associated with the device. From update table 1100 (FIG. 11), various updates and media content may be identified for download to the device. For example, firmware column 1104 (FIG. 11) may identify one or more new firmware versions to apply to the device. Application updates column 1106 (FIG. 11) may identify one or more application updates or patches to apply to the device. Content column 1108 (FIG. 11) may identify one or more media content selections (or media content packages) to pre-store or pre-load onto the device. Some or all of the foregoing updates and media content may have been added to update table 1100 (FIG. 11) from a separate terminal at a kiosk in the retail location. An additional charge may be associated with some of the updates and/or content selections.

If at least one update is available for the device at step 1612, then the update or updates may be received by electronic media device 100 (FIG. 1) at step 1614. The actual data files and media content may be received from any network server (e.g., web server or FTP server) or network file system. A pointer to the actual data or media content may also be included in update table 1100 (FIG. 11). If no updates are available for the device at step 1612 (for example, the device's serial number is not present in serial number column 1102 of table 1100 (FIG. 11)), then illustrative process 1600 may return to step 1604.

Finally, after the updates or media content are received, they may be automatically applied to the device. For example, firmware updates and application patches may be automatically executed on the device at step 1616. Typically, media content is simply stored onto the device (e.g., onto storage device 112 of FIG. 1) for later access by a media player application.

In practice, one or more steps shown in illustrative process 1600 may be combined with other steps, performed in any suitable order, performed in parallel (e.g., simultaneously or substantially simultaneously), or removed.

Various configurations described herein may be combined without departing from the present invention. The above described embodiments of the present invention are presented for purposes of illustration and not of limitation. The present invention also can take many forms other than those explicitly described herein. Accordingly, it is emphasized that the invention is not limited to the explicitly disclosed methods, systems, and apparatuses, but is intended to include variations to and modifications thereof which are within the spirit of the claims.

I claim:

1. Active retail packaging for an electronic media device, the active retail packaging comprising:
   a housing defining a device area for the electronic media device,
   wherein the housing comprises an electrical component configured to receive power from an exterior of the housing and to transmit the power to the device area.

2. The active retail packaging of claim 1, wherein the electrical component is a wire trace.

3. The active retail packaging of claim 2, wherein the wire trace terminates at a connector at the device area.

4. The active retail packaging of claim 2, wherein the wire trace is integrated within the housing.

5. The active retail packaging of claim 1, wherein the electrical component is configured to transfer the power through a wall of the housing.

6. The active retail packaging of claim 1, wherein the electrical component is configured to power the electronic media device while the electronic media device is sealed within the active retail packaging.

7. The active retail packaging of claim 1, further comprising a radio frequency power receiver coupled to the housing.

8. The active retail packaging of claim 1, further comprising a radio frequency power receiver integrated within the housing.

9. Active retail packaging for an electronic media device, the active retail packaging comprising:
   a housing defining a device area for the electronic media device,
   a wire trace extending between an exterior of the housing and the device area.

10. The active retail packaging of claim 9, wherein the wire trace is integrated within the housing.

11. The active retail packaging of claim 9, wherein the housing comprises a first exterior side and a second exterior side opposite the first exterior side, and
    wherein the first wire trace extends between the exterior of the housing at the first exterior side and the device area, and
    wherein a second wire trace extends between the exterior of the housing at the second exterior side and the device area.

12. The active retail packaging of claim 9, wherein the housing comprises a first exterior side and a second exterior side, and
    wherein the first wire trace extends between the exterior of the housing at the first exterior side and the device area,
    wherein a second wire trace extends between the exterior of the housing at the second exterior side and the device area, and
    wherein at least one of the first wire trace and the second wire trace comprises a power connector at the device area, the power connector configured to provide power to an electronic device in the device area.

13. The active retail packaging of claim 9, wherein the housing comprises a first exterior side and a second exterior side, and
    wherein the first wire trace extends between the exterior of the housing at the first exterior side and the device area, wherein a second wire trace extends between the exterior of the housing at the second exterior side and the device area, and wherein at least one of the first wire trace and the second wire trace comprises a data connector at the device area, the data connector configured to provide data to an electronic device in the device area.

14. Active retail packaging for an electronic media device, the active retail packaging comprising:

backing;

a hook protruding from the backing, the hook configured to hold an electronic device to the backing;

an electrical component coupled to the hook, the electrical component configured to provide at least one of power and data to an electronic device held by the hook.

15. The active retail packaging of claim 14, wherein the electrical component is a wire trace, and wherein the wire trace is in-molded or printed on the hook.

16. The active retail packaging of claim 14, wherein the hook is configured to hold an electronic device to the backing by being inserted into an interface of the electronic device, and not extending over a face of the electronic media device.

17. A packaged electronic device, comprising:

the active retail packaging of claim 14; and an electronic media device packaged within the active retail packaging, wherein the hook is inserted into an interface of the electronic device and thereby:

holds the electronic device to the backing, and provides at least one of power and data to an electronic device via the electrical component.

* * * * *